United States Patent [19]
Forbes et al.

[11] Patent Number: 6,104,061
[45] Date of Patent: *Aug. 15, 2000

[54] MEMORY CELL WITH VERTICAL TRANSISTOR AND BURIED WORD AND BODY LINES

[75] Inventors: Leonard Forbes, Corvallis, Oreg.; Wendell P. Noble, Milton, Vt.; Kie Y. Ahn, Chappaqua, N.Y.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 09/031,620

[22] Filed: Feb. 27, 1998

Related U.S. Application Data

[63] Continuation of application No. 08/889,396, Jul. 8, 1997.

[51] Int. Cl.[7] ............................ H01L 29/76; H01L 29/94; H01L 31/62; H01L 31/113
[52] U.S. Cl. .......................... 257/330; 257/329; 257/623
[58] Field of Search ..................... 257/329, 330, 257/623

[56] References Cited

U.S. PATENT DOCUMENTS

| | | | |
|---|---|---|---|
| 4,051,354 | 9/1977 | Choate | 235/312 |
| 4,604,162 | 8/1986 | Sobczak | 156/657 |
| 4,663,831 | 5/1987 | Birrittella et al. | 129/576 E |
| 4,673,962 | 6/1987 | Chatterjee et al. | 357/23.6 |
| 4,761,768 | 8/1988 | Turner et al. | 365/201 |
| 4,766,569 | 8/1988 | Turner et al. | 365/185 |
| 4,920,065 | 4/1990 | Chin et al. | 437/52 |
| 4,958,318 | 9/1990 | Harari | 365/149 |
| 4,987,089 | 1/1991 | Roberts | 437/34 |
| 5,001,526 | 3/1991 | Gotou | 357/23.6 |
| 5,006,909 | 4/1991 | Kosa | 357/23.6 |
| 5,017,504 | 5/1991 | Nishimura et al. | 437/40 |
| 5,021,355 | 6/1991 | Dhong et al. | 437/35 |
| 5,028,977 | 7/1991 | Kenneth et al. | 357/43 |
| 5,057,896 | 10/1991 | Gotou | 357/49 |
| 5,072,269 | 12/1991 | Hieda | 357/23.6 |
| 5,102,817 | 4/1992 | Chatterjee et al. | 437/47 |

(List continued on next page.)

FOREIGN PATENT DOCUMENTS

| | | | |
|---|---|---|---|
| 363066963A | 3/1988 | Japan | 257/305 |
| 5226661 | 9/1993 | Japan . | |

OTHER PUBLICATIONS

Adler, E., et al., "The Evolution of IBM CMOS DRAM Technology", y, 167–188, (Jan./Mar., 1995).

Asai, S., et al., "Technology Challenges for Integration Near and Below 0.1 micrometer", *Proceedings of the IEEE*, 85, Special Issue on Nanometer–Scale Science & Technology, 505–520, (Apr. 1997).

Banerjee, S.K., et al., "Characterization of Trench Transistors for 3–D Memories", 1986 Symposium on VLSI Technology, Digest of Technical Papers, San Diego, CA, 79–80, (May 28–30, 1986).

(List continued on next page.)

*Primary Examiner*—Stephen D. Meier
*Attorney, Agent, or Firm*—Schwegman, Lundberg, Woessner & Kluth P.A.

[57] ABSTRACT

An integrated circuit and fabrication method includes a vertical transistor for a memory cell in a dynamic random access memory (DRAM) or other integrated circuit. Vertically oriented access transistors are formed on semiconductor pillars on buried bit lines. Buried gates and body contacts are provided for each access transistor on opposing sides of the pillars. Buried word lines extend in first alternating trenches orthogonal to the bit lines. The buried word lines interconnect ones of the gates. Buried body lines extend in second alternating trenches orthogonal to the bit lines. The buried body lines interconnect body regions of adjacent access transistors. Unitary and split-conductor gate and body lines are provided for shared or independent signals to access transistors on either side of the trenches. In one embodiment, the memory cell has a surface area that is approximately 4 $F^2$, where F is a minimum feature size. Bulk-semiconductor and semiconductor-on-insulator (SOI) embodiments are provided.

24 Claims, 17 Drawing Sheets

U.S. PATENT DOCUMENTS

| | | | |
|---|---|---|---|
| 5,110,752 | 5/1992 | Lu | 437/47 |
| 5,156,987 | 10/1992 | Sandhu et al. | 437/40 |
| 5,177,028 | 1/1993 | Manning | 437/41 |
| 5,177,576 | 1/1993 | Kimura et al. | 257/71 |
| 5,202,278 | 4/1993 | Mathews et al. | 437/47 |
| 5,208,657 | 5/1993 | Chatterjee et al. | 257/302 |
| 5,216,266 | 6/1993 | Ozaki | 257/302 |
| 5,223,081 | 6/1993 | Doan | 156/628 |
| 5,266,514 | 11/1993 | Tuan et al. | 437/52 |
| 5,316,962 | 5/1994 | Matsuo et al. | 437/52 |
| 5,320,880 | 6/1994 | Sandhu et al. | 427/578 |
| 5,327,380 | 7/1994 | Kersh, III et al. | 365/195 |
| 5,376,575 | 12/1994 | Kim et al. | 437/52 |
| 5,378,914 | 1/1995 | Ohza et al. . | |
| 5,385,853 | 1/1995 | Mohammad . | |
| 5,391,911 | 2/1995 | Beyer et al. | 257/522 |
| 5,392,245 | 2/1995 | Manning | 365/200 |
| 5,393,704 | 2/1995 | Huang et al. | 437/203 |
| 5,396,093 | 3/1995 | Lu | 257/306 |
| 5,410,169 | 4/1995 | Yamamoto et al. | 257/301 |
| 5,414,287 | 5/1995 | Hong | 257/316 |
| 5,414,288 | 5/1995 | Fitch et al. . | |
| 5,422,499 | 6/1995 | Manning | 257/67 |
| 5,427,972 | 6/1995 | Shimizu et al. | 437/52 |
| 5,432,739 | 7/1995 | Pein | 365/185 |
| 5,438,009 | 8/1995 | Yang et al. | 437/52 |
| 5,440,158 | 8/1995 | Sung-Mu | 257/314 |
| 5,445,986 | 8/1995 | Hirota | 437/60 |
| 5,460,316 | 10/1995 | Hefele | 228/39 |
| 5,460,988 | 10/1995 | Hong | 437/43 |
| 5,466,625 | 11/1995 | Hsieh et al. | 437/52 |
| 5,483,094 | 1/1996 | Sharma et al. | 257/316 |
| 5,483,487 | 1/1996 | Sung-Mu | 365/185.33 |
| 5,492,853 | 2/1996 | Jeng et al. | 437/60 |
| 5,495,441 | 2/1996 | Hong | 365/185.01 |
| 5,497,017 | 3/1996 | Gonzales | 257/306 |
| 5,504,357 | 4/1996 | Kim et al. | 257/306 |
| 5,508,219 | 4/1996 | Bronner et al. | 437/52 |
| 5,508,542 | 4/1996 | Geiss et al. | 257/301 |
| 5,519,236 | 5/1996 | Ozaki et al. | 257/302 |
| 5,528,062 | 6/1996 | Hsieh et al. | 257/298 |
| 5,563,083 | 10/1996 | Pein | 437/43 |
| 5,574,299 | 11/1996 | Kim | 257/296 |
| 5,593,912 | 1/1997 | Rajeevakumar | 437/52 |
| 5,616,934 | 4/1997 | Dennison et al. | 257/67 |
| 5,640,342 | 6/1997 | Gonzalez | 365/156 |
| 5,644,540 | 7/1997 | Manning | 365/200 |
| 5,646,900 | 7/1997 | Tsukude et al. | 365/205 |
| 5,691,230 | 11/1997 | Forbes | 437/62 |
| 5,705,415 | 1/1998 | Orlowski et al. | 437/43 |
| 5,719,409 | 2/1998 | Singh et al. . | |

OTHER PUBLICATIONS

Blalock, T.N., et al., "A High–Speed Sensing Scheme for 1T Dynamic RAM's Utilizing the Clamped Bit–Line Sense Amplifier", *IEEE Journal of Solid–State Circuits*, 27, 618–625, (Apr. 1992).

Bomchil, G., et al., "Porous Silicon: The Material and its Applications in Silicon–On–Insulator Technologies", *Applied Surface Science*, 41/42, 604–613, (1989).

Burnett, D., et al., "Implications of Fundamental Threshold Voltage Variations for High–Density SRAM and Logic Circuits", 1994 Symposium on VLSI Technology, Digest of Technical Papers, Honolulu, HI, 15–16, (Jun. 4–7, 1994).

Burnett, D., et al., "Statistical Threshold–Voltage Variation and its Impact on Supply–Voltage Scaling", *Proceedings SPIE: Microelectronic Device and Multilevel Interconnection Technology*, 2636, 83–90, (1995).

Chen, M.J., et al., "Back–Gate Forward Bias Method for Low–Voltage CMOS Digital Cicuits", *IEEE Transactions on Electron Devices*, 43, 904–909, (Jun. 1986).

Chen, M.J., et al., "Optimizing the Match in Weakly Inverted MOSFET's by Gated Lateral Bipolar Action", *IEEE Transactions on Electron Devices*, 43, 766–773, (May 1996).

Chung, I.Y., et al., "A New SOI Inverter for Low Power Applications", Proceedings of the 1996 IEEE International SOI Conference, Sanibel Island, FL, 20–21, (Sep. 30–Oct. 3, 1996).

De, V.K., et al., "Random MOSFET Parameter Fluctuation Limits to Gigascale Integration (GSI)", 1996 Symposium on VLSI Technology, Digest of Technical Papers, Honolulu, HI, 198–199, (Jun. 11–13, 1996).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17, 509–511, (Nov. 1996).

Fong, Y., et al., "Oxides Grown on Textured Single–Crystal Silicon—Dependence on Process and Application in EEPROMs", *IEEE Transactions on Electron Devices*, 37, 583–590, (Mar. 1990).

Fuse, T., et al., "A 0.5V 200MHz 1–Stage 32b ALU Using a Body Bias Controlled SOI Pass–Gate Logic", 1997 IEEE International Solid–State Circuits Conference, Digest of Technical Papers, 286–287, (1997).

Gong, S., et al., "Techniques for Reducing Switching Noise in High Speed Digital Systems", Proceedings of the 8th Annual IEEE International ASIC Conference and Exhibit, 21–24, (1995).

Hao, M.Y., et al., "Electrical Characteristics of Oxynitrides Grown on Textured Single–Crystal Silicon", *Appl. Phys. Lett.*, 60, 445–447, (Jan. 1992).

Harada, M., et al., "Suppression of Threshold Voltage Variation in MTCMOS/SIMOX Circuit Operating Below 0.5 V", 1996 Symposium on VLSI Technology, Digest of Technical Papers, Honolulu, HI, 96–97, (Jun. 11–13, 1996).

Hisamoto, D., et al., "A New Stacked Cell Structure for Giga–Bit DRAMs using Vertical Ultra–Thin SOI (DELTA) MOSFETs", 1991 IEEE International Electron Devices Meeting, Technical Digest, Washington, D.C., 959–961, (Dec. 8–11, 1991).

Hodges, D.A., et al., "MOS Decoders", In: *Analysis and Design of Digital Integrated Circuits*, 2nd Edition, McGraw–Hill Book Co., New York, 354–357, (1988).

Holman, W.T., et al., "A Compact Low Noise Operational Amplifier for a 1.2 Micrometer Digital CMOS Technology", *IEEE Journal of Solid–State Circuits*, 30, 710–714, (Jun. 1995).

Hu, G., et al., "Will Flash Memory Replace Hard Disk Drive?", 1994 IEEE International Electron Device Meeting, Panel Discussion, Session 24, Outline, 1 p., (Dec. 13, 1994).

Huang, W.L., et al., "TFSOI Complementary BiCMOS Technology for Low Power Applications", *IEEE Transactions on Electron Devices*, 42, 506–512, (Mar. 1995).

Jun, Y.K., et al., "The Fabrication and Electrical Properties of Modulated Stacked Capacitor for Advanced DRAM Applications", *IEEE Electron Device Letters*, 13, 430–432, (Aug. 1992).

Jung, T.S., et al., "A 117–mm2 3.3–V Only 128–Mb Multilevel NAND Flash Memory for Mass Storage Applications", *IEEE Journal of Solid–State Circuits*, 31, 1575–1582, (Nov. 1996).

Kang, H.K., et al., "Highly Manufacturable Process Technology for Reliable 256 Mbit and 1Gbit DRAMs", IEEE International Electron Devices Meeting, Technical Digest, San Francisco, CA, 635–638, (Dec. 11–14, 1994).

Kim, Y.S., et al., "A Study on Pyrolysis DMEAA for Selective Deposition of Aluminum", In: *Advanced Metallization and Interconnect Systems for ULSI Applications in 1995*, R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)", *Japanese Journal of Applied Physics*, 34, 6899–6902, (Dec. 1995).

Kohyama, Y., et al., "Buried Bit–Line Cell for 64MB DRAMs", 1990 Symposium on VLSI Technology, Digest of Technical Papers, Honolulu, HI, 17–18, (Jun. 4–7, 1990).

Koshida, N., et al., "Efficient Visible Photoluminescence from Porous Silicon", *Japanese Journal of Applied Physics*, 30, L1221–L1223, (Jul. 1991).

Kuge, S., et al., "SOI–DRAM Circuit Technologies for Low Power High Speed Multigiga Scale Memories", *IEEE Journal of Solid–State Circuits*, 31, 586–591, (Apr. 1996).

Lantz, II, L., "Soft Errors Induced By Alpha Particles", *IEEE Transactions on Reliability*, 45, 174–179, (Jun. 1996).

Lehmann, V., "The Physics of Macropore Formation in Low Doped n–Type Silicon", *Journal of the Electrochemical Society*, 140(10), 2836–2843, (Oct. 1993).

Lu, N., et al., "The SPT Cell—A New Substrate–Plate Trench Cell for DRAMs", 1985 IEEE International Electron Devices Meeting, Technical Digest, Washington, D.C., 771–772, (Dec. 1–4, 1985).

MacSweeney, D., et al., "Modelling of Lateral Bipolar Devices in a CMOS Process", IEEE Bipolar Circuits and Technology Meeting, Minneapolis, MN, 27–30, (Sep. 1996).

Maeda, S., et al., "A Vertical Phi–Shape Transistor (VPhiT) Cell for 1 Gbit DRAM and Beyond", 1994 Symposium of VLSI Technology, Digest of Technical Papers, Honolulu, HI, 133–134, (Jun. 7–9, 1994).

Maeda, S., et al., "Impact of a Vertical Phi–Shape Transistor (VPhiT) Cell for 1 Gbit DRAM and Beyond", *IEEE Transactions on Electron Devices*, 42, 2117–2123, (Dec. 1995).

Malaviya, S., *IBM TBD*, 15, p. 42, (Jul. 1972).

Nitayama, A., et al., "High Speed and Compact CMOS Circuits with Multipillar Surrounding Gate Transistors", *IEEE Transactions on Electron Devices*, 36, 2605–2606, (Nov. 1989).

Ohno, Y., et al., "Estimation of the Charge Collection for the Soft–Error Immunity by the 3D–Device Simulation and the Quantitative Investigation", *Simulation of Semiconductor Devices and Processes*, 6, 302–305, (Sep. 1995).

Oowaki, Y., et al., "New alpha–Particle Induced Soft Error Mechanism in a Three Dimensional Capacitor Cell", *IEICE Transactions on Electronics*, 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics*, 76–C, 1604–1610, (Nov. 1993).

Ozaki, T., et al., "A Surrounding Isolation–Merged Plate Electrode (SIMPLE) Cell with Checkered Layout for 256Mbit DRAMs and Beyond", 1991 IEEE International Electron Devices Meeting, Washington, D.C., 469–472, (Dec. 8–11, 1991).

Parke, S.A., et al., "A High–Performance Lateral Bipolar Transistor Fabricated on SIMOX", *IEEE Electron Device Letters*, 14, 33–35, (Jan. 1993).

Pein, H., et al., "A 3–D Sidewall Flash EPROM Cell and Memory Array", *IEEE Transactions on Electron Devices*, 40, 2126–2127, (Nov., 1993).

Pein, H., et al., "Performance on the 3–D PENCIL Flash EPROM Cell and Memory Array", IEEE Transactions on Electron Devices, 42, 1982–1991, (Nov. 1995).

Pein, H.B., et al., "Performance of the 3–D Sidewall Flash EPROM Cell", *IEEE International Electron Devices Meeting, Technical Digest*, 11–14, (1993).

Rao, K.V., et al., "Trench Capacitor Design Issues in VLSI DRAM Cells", 1986 IEEE International Electron Devices Meeting, Technical Digest, Los Angeles, CA, 140–143, (Dec. 7–10, 1986).

Richardson, W.F., et al., "A Trench Transistor Cross–Point DRAM Cell", IEEE International Electron Devices Meeting, Washington, D.C., 714–717, (Dec. 1–4, 1985).

Sagara, K., et al., "A 0.72 micro–meter2 Recessed STC (RSTC) Technology for 256Mbit DRAMs using Quarter–Micron Phase–Shift Lithography", 1992 Symposium on VLSI Technology, Digest of Technical Papers, Seattle, WA, 10–11, (Jun. 2–4, 1992).

Saito, M., et al., "Technique for Controlling Effective Vth in Multi–Gbit DRAM Sense Amplifier", 1996 Symposium on VLSI Circuits, Digest of Technical Papers, Honolulu, HI, 106–107, (Jun. 13–15, 1996).

Shah, A.H., et al., "A 4–Mbit DRAM with Trench–Transistor Cell", *IEEE Journal of Solid–State Circuits*, SC–21, 618–625, (Oct. 1986).

Shah, A.H., et al., "A 4Mb DRAM with Cross–Point Trench Transistor Cell", 1986 IEEE International Solid–State Circuits Conference, Digest of Technical Papers, 268–269, (Feb. 21, 1986).

Sherony, M.J., et al., "Reduction of Threshold Voltage Sensitivity in SOI MOSFET's", *IEEE Electron Device Letters*, 16, 100–102, (Mar. 1995).

Shimomura, K., et al., "A 1V 46ns 16Mb SOI–DRAM with Body Control Technique", 1997 IEEE International Solid–State Circuits Conference, Digest of Technical Papers, 68–69, (Feb. 6, 1997).

Stellwag, T.B., et al., "A Vertically–Integrated GaAs Bipolar DRAM Cell", *IEEE Transactions on Electron Devices*, 38, 2704–2705, (Dec. 1991).

Suma, K., et al., "An SOI–DRAM with Wide Operating Voltage Range by CMOS/SIMOX Technology", *IEEE Journal of Solid–State Circuits*, 29, 1323–1329, (Nov. 1994).

Sun, J., "CMOS Technology for 1.8V and Beyond", Int'l Symp. on VLSI Technology, Systems and Applications: Digest of Technical Papers, 293–297, (1997).

Sunouchi, K., et al., "A Surrounding Gate Transistor (SGT) Cell for 64/256Mbit DRAMs", 1989 IEEE International Electron Devices Meeting, Technical Digest, Washington, D.C., 23–26, (Dec. 3–6, 1989).

Sunouchi, K., et al., "Process Integration for 64M DRAM Using an Asymmetrical Stacked Trench Capacitor (AST) Cell", 1990 IEEE International Electron Devices Meeting, San Francisco, CA, 647–650, (Dec. 9–12, 1990).

Takai, M., et al., "Direct Measurement and Improvement of Local Soft Error Susceptibility in Dynamic Random Access Memories", *Nuclear Instruments & Methods in Physics Research*, B–99, Proceedings of the 13th International Conference on the Application of Accelerators in Research and Industry, Denton, TX, 562–565, (Nov. 7–10, 1994).

Takao, Y., et al., "A 4–um(2) Full–CMOS SRAM Cell Technology for 0.2–um High Performance Logic LSIs", 1997 Symp. on VLSI Technology: Digest of Technical Papers, Kyoto, Japan, 11–12, (1997).

Takato, H., et al., "High Performance CMOS Surrounding Gate Transistor (SGT) for Ultra High Density LSIs", IEEE International Electron Devices Meeting, Technical Digest, 222–225, (1988).

Takato, H., et al., "Impact of Surrounding Gate Transistor (SGT) for Ultra–High Density LSI's", *IEEE Transactions on Electron Devices,* 38, 573–578, (Mar. 1991).

Tanabe, N., et al., "A Ferroelectric Capacitor Over Bit–Line (F–COB) Cell for High Density Nonvolatile Ferroelectric Memories", 1995 Symposium on VLSI Technology, Digest of Technical Papers, Kyoto, Japan, 123–124, (Jun. 6–8, 1995).

Temmler, D., "Multilayer Vertical Stacked Capacitors (MVSTC) for 64Mbit and 256Mbit DRAMs", 1991 Symposium on VLSI Technology, Digest of Technical Papers, Oiso, 13–14, (May 28–30, 1991).

Terauchi, M., et al., "A Surrounding Gate Transistor (SGT) Gain Cell for Ultra High Density DRAMs", 1993 Symposium on VLSI Technology, Digest of Technical Papers, Kyoto, Japan, 21–22, (1993).

Tsui, P.G., et al., "A Versatile Half–Micron Complementary BiCMOS Technology for Microprocessor–Based Smart Power Applications", *IEEE Transactions on Electron Devices,* 42, 564–570, (Mar. 1995).

Verdonckt–Vandebroek, S., et al., "High–Gain Lateral Bipolar Action in a MOSFET Structure", *IEEE Transactions on Electron Devices* 38, 2487–2496, (Nov. 1991).

Wang, N., *Digital MOS Integrated Circuits,* Prentice Hall, Inc., Englewood Cliffs, NJ, p. 328–333, (1989).

Wang, P.W., et al., "Excellent Emission Characteristics of Tunneling Oxides Formed Using Ultrathin Silicon Films for Flash Memory Devices", *Japanese Journal of Applied Physics,* 35, 3369–3373, (Jun. 1996).

Watanabe, H., et al., "A New Cylindrical Capacitor Using Hemispherical Grained Si (HSG–Si) for 256Mb DRAMs", IEEE International Electron Devices Meeting, Technical Digest, San Francisco, CA, 259–262, (Dec. 13–16, 1992).

Watanabe, H., et al., "A Novel Stacked Capacitor with Porous–Si Electrodes for High Density DRAMs", 1993 Symposium on VLSI Technology, Digest of Technical Papers, Kyoto, Japan, 17–18, (1993).

Watanabe, H., et al., "An Advanced Fabrication Technology of Hemispherical Grained (HSG) Poly–Si for High Capacitance Storage Electrodes", Extended Abstracts of the 1991 International Conference on Solid State Devices and Materials, Yokohama, Japan, 478–480, (1991).

Watanabe, H., et al., "Device Application and Structure Observation for Hemispherical–Grained Si", *J. Appl. Phys.,* 71, 3538–3543, (Apr. 1992).

Watanabe, H., et al., "Hemispherical Grained Silicon (HSG–Si) Formation on In–Situ Phosphorous Doped Amorphous–Si Using the Seeding Method", Extended Abstracts of the 1992 International Conference on Solid State Devices and Materials, Tsukuba, Japan, 422–424, (1992).

Watanabe, S., et al., "A Novel Circuit Technology with Surrounding Gate Transistors (SGT's) for Ultra High Density DRAM's", *IEEE Journal of Solid–State Circuits,* 30, 960–971, (Sep. 1995).

Yamada, T., et al., "A New Cell Structure with a Spread Source/Drain (SSD) MOSFET and a Cylindrical Capacitor for 64–Mb DRAM's", *IEEE Transactions on Electron Devices,* 38, 2481–2486, (Nov. 1991).

Yamada, T., et al., "Spread Source/Drain (SSD) MOSFET Using Selective Silicon Growth for 64Mbit DRAMs", 1989 IEEE International Electron Devices Meeting, Technical Digest, Washington, D.C., 35–38, (Dec. 3–6, 1989).

Yoshikawa, K., "Impact of Cell Threshold Voltage Distribution in the Array of Flash Memories on Scaled and Multilevel Flash Cell Design", 1996 Symposium on VLSI Technology, Digest of Technical Papers, Honolulu, HI, 240–241, (Jun. 11–13, 1996).

MEMORY CELL WITH VERTICAL TRANSISTOR AND BURIED WORD AND BODY LINES

This application is a continuation of U.S. patent application Ser. No. 08/889,396, filed Jul. 8, 1997, (the '396 Application). The '396 Application is incorporated herein by reference.

FIELD OF THE INVENTION

The present invention relates generally to integrated circuits, and particularly, but not by way of limitation, to semiconductor memories such as a dynamic random access memory (DRAM) having a memory cell with a vertical transistor and buried word lines and body lines.

BACKGROUND OF THE INVENTION

Semiconductor memories, such as dynamic random access memories (DRAMs), are widely used in computer systems for storing data A DRAM memory cell typically includes an access field-effect transistor (FET) and a storage capacitor. The access FET allows the transfer of data charges to and from the storage capacitor during ring and writing operations. The data charges on the storage capacitor are periodically refreshed during a refresh operation.

One consideration in using such access FETs is in providing a body bias voltage to the body portion of the memory cell access FET to improve memory cell operation. The body bias voltage allows the memory cell to operate from a low power supply voltage, such as 1.5 volts, from which a gate voltage controlling the access FET is derived. Turning the access FET on to transfer data to or from the storage capacitor requires a gate voltage in excess of a turn-on threshold voltage. However, low power supply voltages, such as 1.5 volts, may not provide sufficient overdrive voltage in excess of the threshold voltage to fully turn on the access FET. The gate voltage required for turning on the access FET can be reduced by controlling the body bias voltage. When the access FET is turned off, the body bias voltage also controls a subthreshold leakage current of the access FET. The access FET is turned off during a time period when data is stored as charge on the storage capacitor. During the time period when the access FET is turned off, the subthreshold leakage current removes some of the stored data, charges from the storage node of the storage capacitor. The body bias voltage value controls the threshold voltage of the access FET that is coupled to the storage node. By increasing the threshold voltage of the access FET when it is turned off, the subthreshold leakage current is reduced. Without a proper body bias voltage, the subthreshold leakage current would lead to short data retention times.

Providing the body bias voltage to the memory cell access FETs requires a conductive body line that interconnects body contacts to the access FET body regions that receive the body bias voltage. The body line, as well as bit line, word line, and other such conductors all occupy integrated circuit surface area. To increase DRAM data storage density, the surface area of each memory cell, referred to as its "footprint", must be minimized. However, conventional memory cells typically require bit, word, and body lines on the upper surface of the memory cell, requiring surface area in addition to that of the memory cell storage capacitor.

Memory density is typically limited by a minimum lithographic feature size (F) that is imposed by lithographic processes used during fabrication. For example, the present generation of high density dynamic random access memories (DRAMs), which are capable of storing 256 Megabits of data, typically require an area of $8F^2$ per bit of data. There is a need in the art to provide even higher density memories in order to further increase data storage capacity and reduce manufacturing costs. Increasing the data storage capacity of semiconductor memories requires a reduction in the size of the access FET and storage capacitor of each memory cell. However, other factors, such as subthreshold leakage currents and alpha-particle induced soft errors, require that larger storage capacitors be used. Thus, there is a need in the art to increase memory density while allowing the use of storage capacitors that provide sufficient immunity to leakage currents and soft errors. There is also a need in the broader integrated circuit art for dense structures and fabrication techniques. There is a further need in the art to increase integrated circuit density while providing body bias voltage signals that are capable of improving the characteristics of both "on" and "off" access FET switching devices.

SUMMARY OF THE INVENTION

The present invention provides an integrated circuit including a pillar of semiconductor material that extends outwardly from a working surface of a substrate. The pillar has a number of sides. A transistor is formed having body and first and second source/drain regions within the pillar. The transistor includes a gate and a body contact that are each associated with a side of the pillar.

The invention also provides a memory device including an array of memory cells. Each cell includes a transistor. Each transistor includes a semiconductor pillar forming body and first and second source/drain regions. The transistor also includes a gate and a body contact disposed adjacent to opposing sides of the pillar. The memory device also includes a plurality of substantially parallel word lines. Each word line is disposed orthogonally to the bit lines in a trench between columns of the memory cells. Each word line allows addressing of gates of the transistors of the memory cells that are adjacent to the trench in which the word line is disposed. The memory device also includes a plurality of substantially parallel body lines. The body lines are interdigitated with the word lines. Each body line is disposed orthogonally to the bit lines in a trench between columns of the memory cells. Each body line provides a signal to body regions of the transistors of the memory cells that are adjacent to the trench in which the body line is disposed. A plurality of bit lines is provided, proximal to the substrate. The bit lines interconnect ones of the first source/drain regions of ones of the memory cells. In one embodiment, the pillars extend outwardly from an insulating portion of the substrate. In another embodiment, the pillars extend outwardly from a semiconductor portion of the substrate.

The invention also provides a method of fabricating an integrated circuit. According to one embodiment of the method, a substrate is provided, and a plurality of bit lines are formed on the substrate. A plurality of access transistors are formed on each of the bit lines. Each access transistor includes a first source/drain region shared by at least a portion of the bit line. Each access transistor also includes a body region and second source/drain region formed vertically on the first source/drain region. A plurality of isolation trenches are formed in the substrate, orthogonal to the bit lines. Each trench is located between access transistors on the orthogonal bit lines. A word line is formed in a first one of the trenches. The word line controls conduction between first and second source/drain regions of access transistors that are adjacent to a first side of the first trench. A body line is formed in a second one of the trenches. The body line interconnects body regions of access transistors that are adjacent to a first side of the second trench.

In one embodiment, the word line also controls conduction between first and second source/drain regions of access transistors that are adjacent to a second side of the first trench. In another embodiment, the body line also interconnects body regions of access transistors that are adjacent to a second side of the second trench.

In a further embodiment, another word line is formed in the first trench, for controlling conduction between first and second source/drain regions of access transistors that are adjacent to a second side of the first trench. In yet a further embodiment, another body line is formed in the second trench, which interconnects body regions of access transistors that are adjacent to a second side of the second trench.

Thus, the invention provides high density integrated circuit structures and fabrication methods, such as for DRAM memory cell arrays and other semiconductor devices. One aspect of the invention allows for buried bit, word, and body lines, providing high integration density. Each memory cell can be fabricated in a surface area that is approximately $4F^2$, where F is a minimum lithographic feature size. In one embodiment, a common word line is shared by all of the access FETs that are located along both sides of the trench in which the word line is located. In another embodiment, a common body line is shared by all of the access FETs that are located along both sides of the trench in which the body line, is located. In a further embodiment, split word lines are provided in first alternating trenches, and the split word lines provide separate addressing of gate regions of access FETs on opposite sides of the trench. In yet a further embodiment, split body lines are provided in second alternating trenches, and the split body lines provide separate interconnection of body contacts to body regions of the access FETs on opposite sides of the trench. Each of the unitary and split word and body line embodiments can be fabricated on a bulk semiconductor substrate, or on a semiconductor-on-insulator (SOI) substrate that results from using an SOI starting material, or by forming SOI regions during fabrication. The SOI embodiments provide greater immunity to alpha-particle induced soft errors, allowing the use of smaller storage capacitors.

BRIEF DESCRIPTION OF THE DRAWINGS

In the drawings, like numerals describe substantially similar components throughout the several views.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrate circuits are formed, and also to such structure during various stages of integrated circuit fabrication. Both terms include doped and undoped semiconductors, epitaxial layers of a semiconductor on a supporting semiconductor or insulating material, combinations of such layers, as well as other such structures that are known in the art. The following detailed description is not to be taken in a limiting sense, and the scope of the present invention is defined only by the appended claims.

Figure 1:
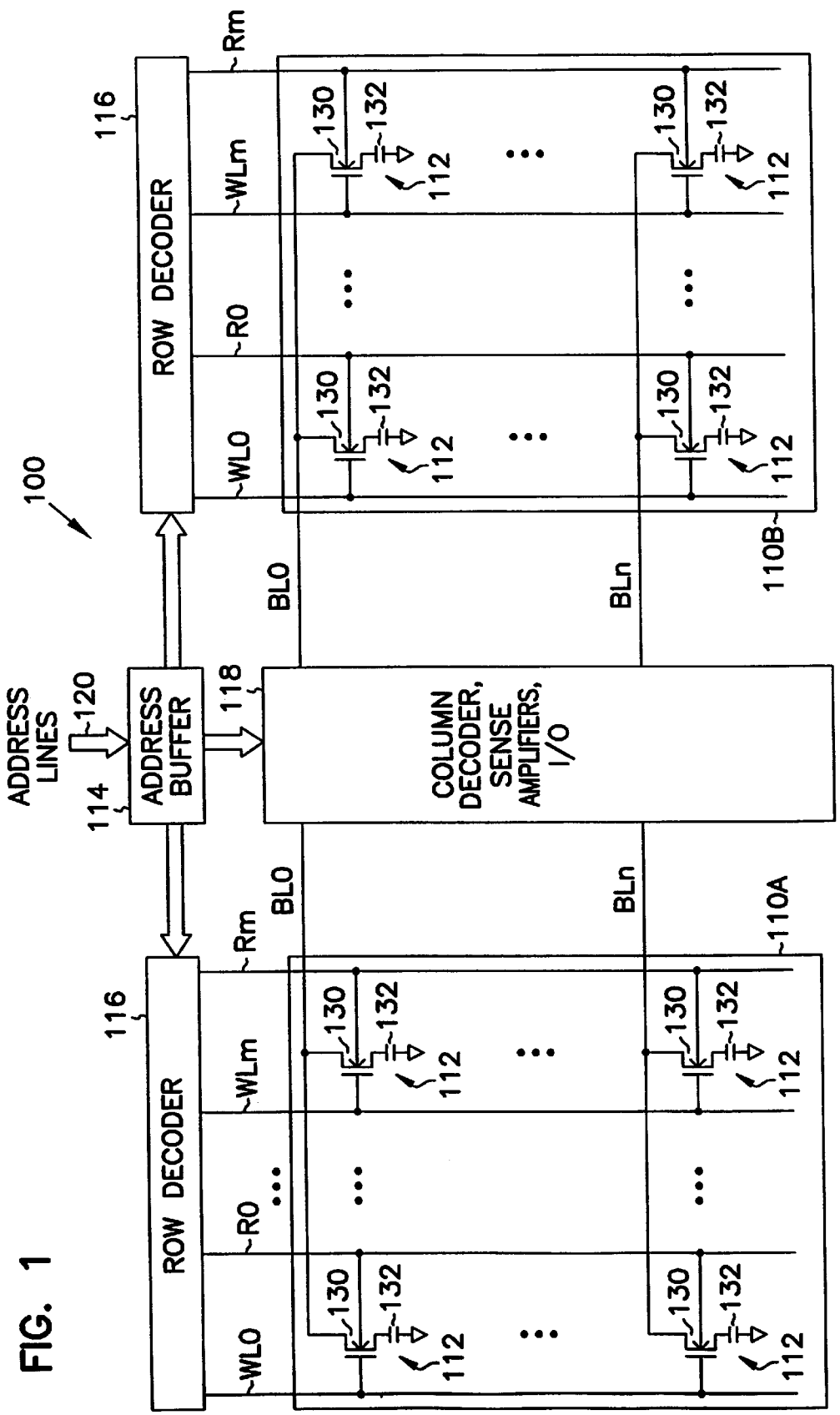
FIG. 1 is a schematic representation illustrating generally one embodiment of a semiconductor memory according to the invention.

FIG. 1 is a schematic representation illustrating generally one embodiment of a semiconductor memory 100 device incorporating an array of memory cells provided by the invention. In FIG. 1, memory 100 illustrates, by way of example but not by way of limitation, a dynamic random access memory (DRAM), but the invention also includes any other integrated circuit or semiconductor memory devices. Memory 100 includes memory cell arrays 110, such as 110A and 110B. Each array 110 includes M rows and N columns of memory cells 112.

In the exemplary embodiment of FIG. 1, each memory cell includes a transfer device, such as n-channel cell access field-effect transistor (FET) 130 or any other transistor or switching device. Access FET 130 is coupled to a storage node of a storage capacitor 132. The other terminal of storage capacitor 132 is coupled to a reference voltage such as a ground voltage VSS. Each of the M rows includes one of word lines WL0, WL1 . . . WLm−1, WLm coupled to the input nodes of memory cells 112 at respective gate terminals of access FETs 130 or to the control terminal of an equivalent switching device. Each of the M rows also includes one of body lines R1, R2, . . . ,Rm−1, Rm coupled to the body terminals of access FETs 130 in memory cells 112. Each of the N columns includes one of bit lines BL0, BL1 . . . BLn−1, BLn.

Bit lines BL0–BLn are used to write to and read data from memory cells 112. Word lines WL0–WLm are used to access a particular row of memory cells 112 that is to be written or read. Addressing circuitry is also included. For example, address buffer 114 controls column decoders 118, which also include sense amplifiers and input/output circuitry that are coupled to bit lines BL0–BLn. Address buffer 114 also controls row decoders 116. Row decoders 116 and column decoders 118 selectably access memory cells 112 in response to address signals that are provided on address lines 120 during write and read operations. The address signals are typically provided by an external controller such as a microprocessor or other memory controller. Each of memory cells 112 has a substantially identical structure, and accordingly, only one memory cell 112 structure is described herein.

Figure 2:
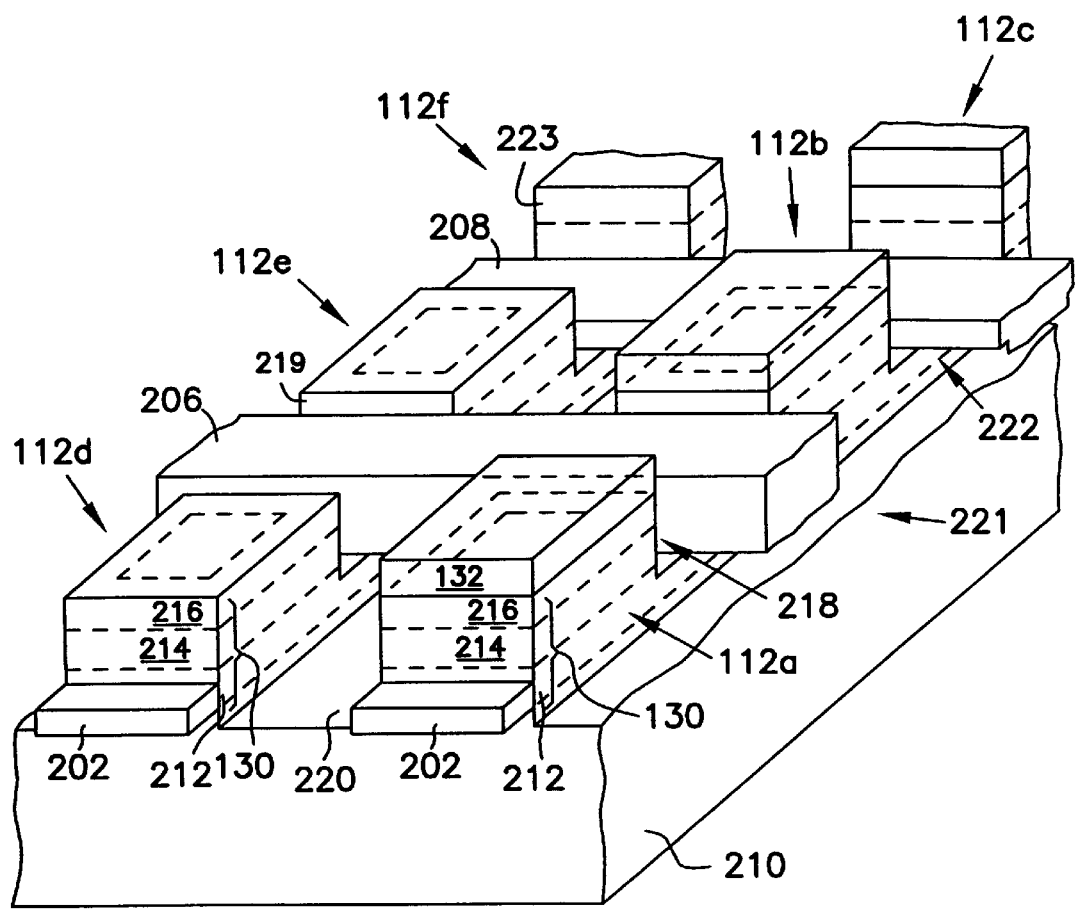
FIG. 2 is a perspective view illustrating generally one embodiment of a portion of a memory according to the present invention.

FIG. 2 is a perspective view illustrating generally one embodiment of a portion of a memory 100 according to the present invention. FIG. 2 illustrates portions of six memory cells 112a–f, including portions of vertically oriented access FETs 130 therein. Conductive segments of bit lines 202 represent particular ones of bit lines BL0–BLn. Conductive segments of word line 206 represents any one of word lines WL0–WLm, which provide integrally formed gate regions for access FETs 130 between which the particular word line 206 is interposed. Conductive segments of body line 208 represents any one of body lines R0–Rm, which provide interconnected electrical body contacts to body regions of access FETs 130 between which the particular body line 208 is interposed. Thus, word lines WL0–WLm and body lines R0–Rm are alteratingly disposed (interdigitated) within the array 110. The detailed description of the structure of memory cell 112 refers only to memory cells 112a–f, bit lines 202, word line 206 and body line 208 that are associated with memory cells 112a–f. However, the following description similarly applies to all memory cells 112 and similar conductive lines in array 110.

In FIG. 2, vertically oriented access FETs 130 are formed in semiconductor pillars that extend outwardly from an underlying substrate 210. As described below, substrate 210 includes bulk semiconductor starting material semiconductor-on-insulator (SOI) starting material, or SOI material that is formed from a bulk semiconductor starting material during processing.

In one example embodiment, using bulk silicon processing techniques, access FETs 130 include an n+ silicon layer formed on a bulk silicon substrate 210 to produce first source/drain regions 212 of access FETs 130 and integrally formed n++ conducively doped bit lines 202. Bit lines 202 define a particular column of memory cells 112. A p– silicon layer is formed on n+ first source/drain region 212 to form the body region 214 of access FET 130. Inversion channels may be capacitively generated at the sidewalls of the body region 214 of the semiconductor pillar under the control of word line 206. Word line 206 includes the gate region of adjacent access FETs 130. A further n+ silicon layer is formed on p– body region 214 to produce second source/drain region 216 of access FET 130. Storage capacitors 132 are formed on the second/source drain regions 216.

Word lines WL0–WLm and body lines R0–Rm are alternatively disposed (interdigitated) within the array 110. For example, word line 206 is interposed between semiconductor pillars of memory cell pairs 112a–b and 112d–e. Body line 208 is interposed between semiconductor pillars of memory cell pairs 112b–c and 112e–f. Thus, as seen from FIG. 2, access FETs 130 are formed on bit lines 202 in semiconductor pillars extending outwardly from substrate 210. Such semiconductor pillars include body regions 214, and first and second source drain regions 212 and 216, respectively. In this embodiment, bit lines 202 contact bulk semiconductor substrate 210, and body lines 208 contact body regions 214 of adjacent access FETs 130.

Isolation trenches provide isolation between access FETs 130 of adjacent memory cells 112. Columns of memory cells 112 are separated by a trench 220 that is subsequently filled with a suitable insulating material such as silicon dioxide ($SiO_2$), referred to as "oxide". For example, trench 220 provides isolation between memory cells 112a and 112d and between memory cells 112b and 112e. Rows of memory cells 112 are alternatingly separated by trenches 221 and 222. Trenches 221 and 222 are each separated from substrate 210 by an underlying insulating layer, as described below. For example, trench 221 carries word line 206 and provides isolation between memory cells 112a and 112b and between memory cells 112d and 112e. In addition, trench 222 provides isolation between portions of memory cells 112b and 112c and memory cells 112e and 112f. Trenches 221 and 222 extend substantially orthogonally to bit lines 202.

Word line 206 is spaced apart from the vertical sidewalls 219 of trench 221, isolated therefrom by gate oxide 218. As a result, word line 206 is capacitively coupled to body regions 214 of adjacent access FETs 130. In one embodiment, word line 206 is formed of a refractory metal, such as tungsten or titanium. In another embodiment, word line 206 is formed of n+ doped polysilicon, depending upon the process that is used in fabricating the memory cells. Similarly, other suitable conductors could also be used for word line 206. Word line 206 includes gate regions that are capacitively coupled to inversion channel regions of access FETs 130 of adjacent memory cells 112a–b and 112d–e.

Trench 222 carries body line 208, which conductively interconnects body regions 214 of access FETs 130 of memory cells 112b–c and 112e–f for applying a body bias voltage thereto, as described below. In one embodiment, body line 208 is formed of a refractory metal, such as tungsten or titanium. In another embodiment, body line 206 is formed of p+ doped polysilicon to obtain an ohmic contact to p– body regions 214. Similarly, other suitable conductors could also be used for body line 208.

In operation, memory 100 receives an address of a particular memory cell 112 at address buffer 114. Address buffer 114 identifies one of the word lines WL0–WLm of the particular memory cell 112 to row decoder 116. Row decoder 116 selectively activates the particular word line WL0–WLm to activate access FETs 130 of each memory cell 112 that is connected to the selected word line WL0–WLm. Column decoder 118 selects the one of bit lines BL0–BLn of the particularly addressed memory cell 112. For a write operation, data received by input/output circuitry is coupled to the one of bit lines BL0–BLn and through the access FET 130 to charge or discharge the storage capacitor 132 of the selected memory cell 112 to represent binary data. For a read operation, data stored in the selected memory cell 112, as represented by the charge on its storage capaicitor 132, is coupled to the one of bit lines BL0–BLn, amplified, and a corresponding voltage level is provided to the input/ output circuits.

A body bias voltage signal is applied to a body portions 214 of access FETs 130 in a row of memory cells 112. The body bias voltage is synchronously applied through one of body lines R0–RM, such as through body line 208, together with a word line activation signal that is applied to one of word lines WL0–WLm, such as to word line 206, for activating access FETs 130 of the same row of memory cells 112.

For example, in a normal standby state, word line 206 is provided approximately 0 Volts. During this same standby state, body line 208 is provided a bias voltage of approximately −1.5 V to increase the threshold voltage magnitude of the access FET 130, reduce subthreshold leakage currents, and increase data retention time. When the word line activation signal is applied, word line 206 is provided approximately 1.5 Volts to turn on the access FET 130 and body line 208 is provided approximately 0.5 Volts in order to decrease the turn-on threshold voltage magnitude of the access FET 130 and thereby increase the effective gate overdrive voltage provided on the word line 206. Word line 206 provides gate regions that control access FETs 130 on either side of the word line 206. Thus, in one embodiment, both adjacent ones of body lines R0–RM, on each side of the word line 206, are synchronously activated together with word line 206, as described above, in order to provide body bias voltages to these same access FET's 130.

Figure 3:
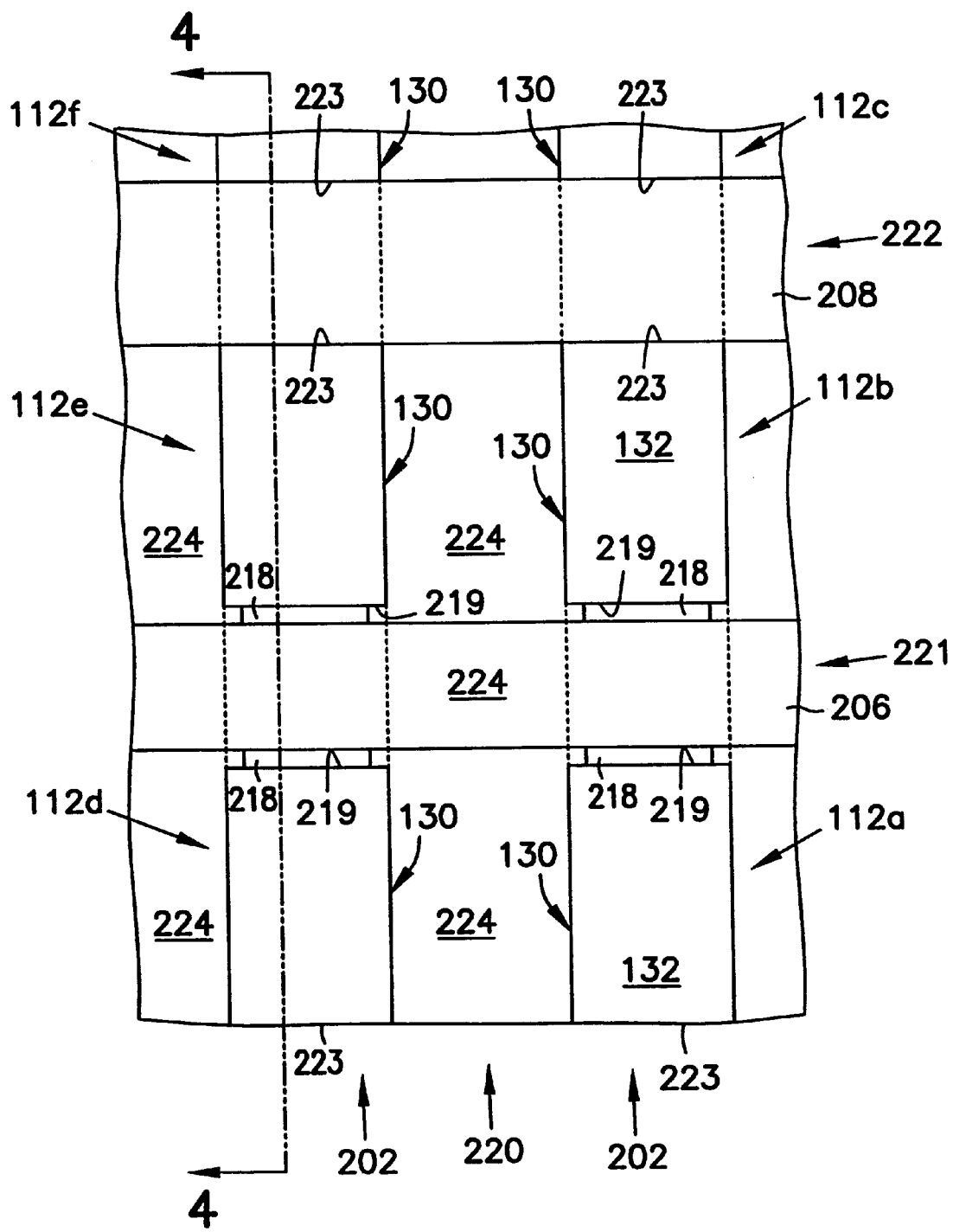
FIG. 3 is a plan view illustrating generally memory cells according to one embodiment of the invention as viewed from above the structure formed on the substrate.

FIG. 3 is a plan view illustrating generally memory cells 112a–f as viewed from above the structures formed on substrate 210. FIG. 3 illustrates, portions of a subsequently formed insulator such as oxide 224, formed in trenches 220 to provide isolation between memory cells 112. In this embodiment, word line 206 is shared between gates of access FETs 130 of memory cells 112 in adjacent rows, such as between memory cells 112a–b and 112d–e. Word line 206 is also shared between gates of other access FETs 130 that are in the same adjacent rows, but coupled to different bit lines 202. Word line 206 is located in trench 221 that extends between the semiconductor pillars of memory cells 112a–b. Word line 206 is separated by gate oxide 218 from the vertical sidewalls 219 of the semiconductor pillars on each side of trench 221.

Body line 208 provides body contact interconnections for body regions 214 of access FETs 130 of memory cells 112 in adjacent rows, such as between memory cells 112b–c and 112e–f. Body line 208 is also shared between body regions 214 of other access FETs 130 that are in the same adjacent rows, but coupled to different bit lines 202. Body line 208 is located in trench 222 that extends between the semiconductor pillars of memory cells 112b–c. Body line 208 mechanically and electrically contacts the body region 214 portions of the vertical sidewalls 223 of the semiconductor pillars on each side of trench 222.

Figure 4:
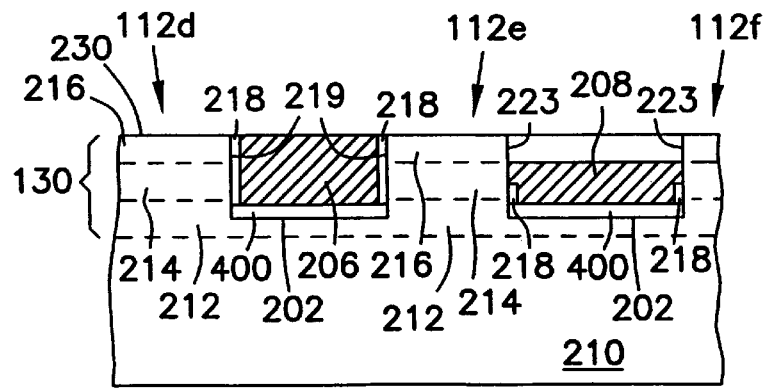
FIG. 4 is a cross-sectional view taken along the cut line 4—4 of FIG. 3.

FIG. 4 is a cross-sectional view taken along the cut line 4—4 of FIG. 3. In FIG. 4, word line 206 and body line 208 are buried below the active semiconductor surface 230 of the semiconductor pillar in the memory cells 112. Active semiconductor surface 230 represents an upper semiconductor portion of second source/drain region 216. Word line 206 is isolated from adjacent semiconductor pillars by gate oxide 218. Word line 206 provides integrally formed gate portions that are capacitively coupled to adjacent access FET 130 body regions 214, such as for forming inversion channel regions therein. Body line 208 provides mechanical and electrical body contacts to vertical sidewalls 223 of body regions 214 of adjacent access FETs 130.

Burying word line 206 and body line 208 below semiconductor surface 230 provides additional space on the upper portion of memory cell 112 for formation of storage capacitors 132. Increasing the area available for forming storage capacitor 132 increases the possible obtainable capacitance value of storage capacitor 132 and increases the data storage density of memory array 110. In one embodiment, storage capacitor 132 is a stacked capacitor that is formed using any of the many capacitor structures and process sequences known in the art. Other techniques could also be used for implementing storage capacitor 132. Contacts to word line 206 and body line 208, such as for providing control signals thereto, can be made outside of the memory array 110.

As illustrated in the plan view of FIG. 3, word lines 206 and body lines 208 are shared between adjacent memory cells 112. As a result, only one-half the surface line width of each is allocated to each memory cell 112. The row pitch of each cell, measured from the centerline of word line 206 to the centerline of body line 208, can be approximately 2F, where F is a minimum lithographic feature size. F corresponds to the length and width presented by the surface of a minimum-sized semiconductor pillar in each memory cell 112. The column pitch of each cell, measured between centerlines of bit lines 202, can be approximately 2F. Thus, the surface area of each memory cell 112 can be approximately $4F^2$.

Figure 5A:
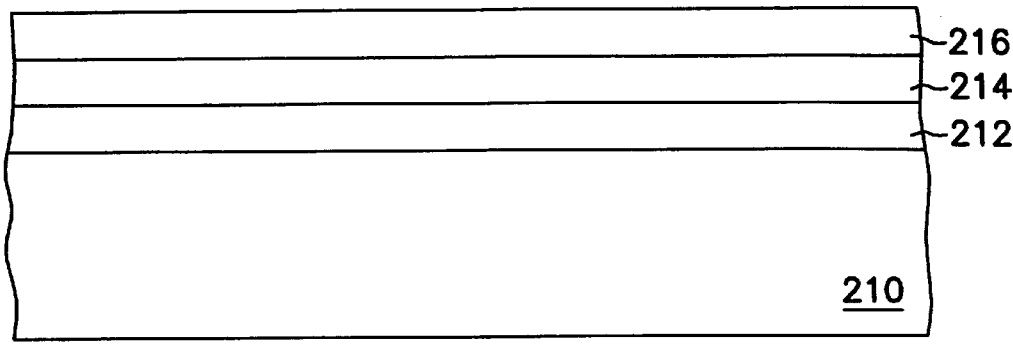
FIGS. 5A–N describe generally various processing techniques of one embodiment of a method of fabricating memory cells according to the invention.
Figure 5B:
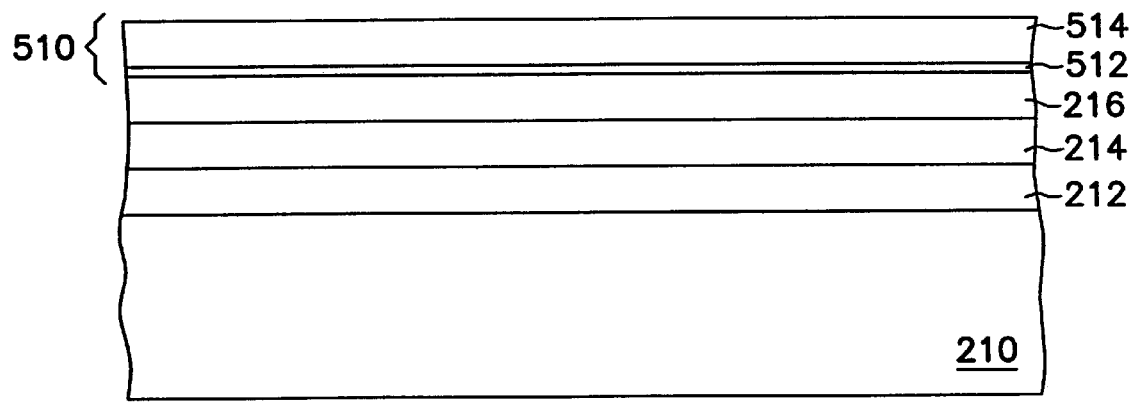
Figure 5C:
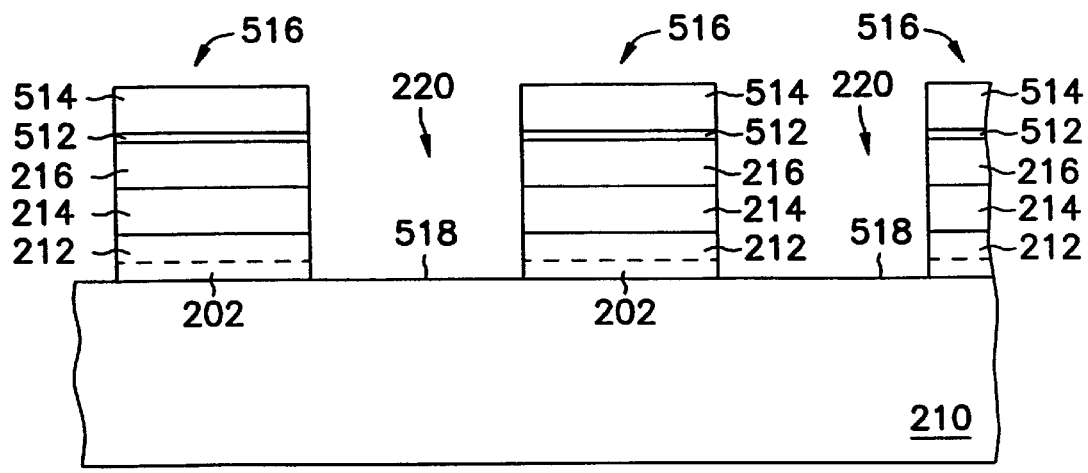
Figure 5D:
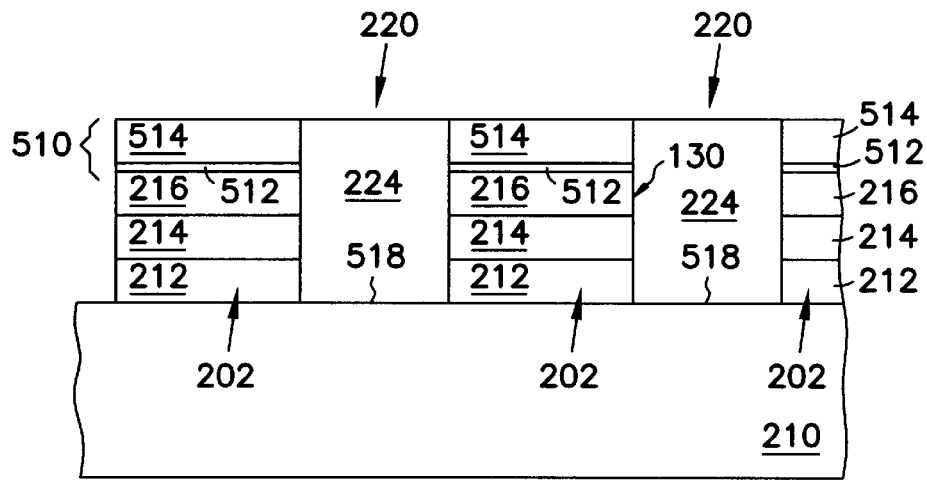
Figure 5E:
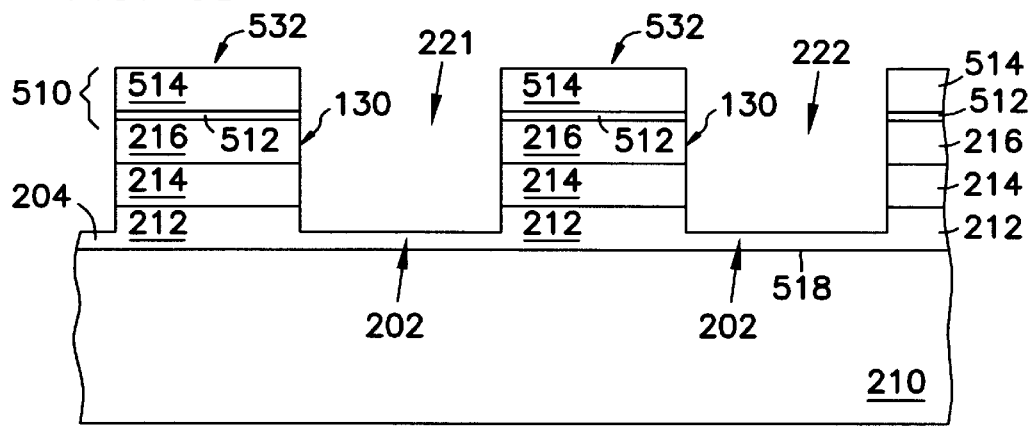
Figure 5F:
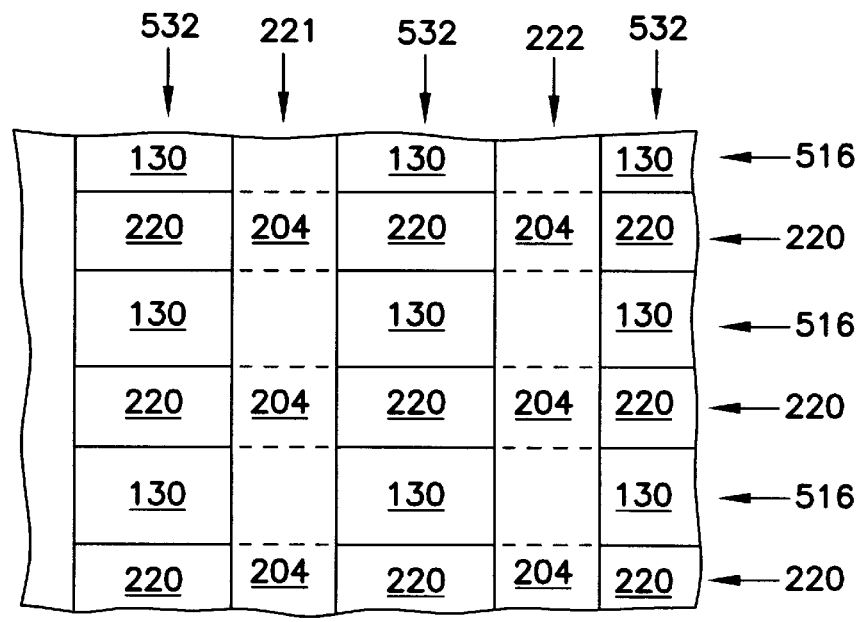
Figure 5G:
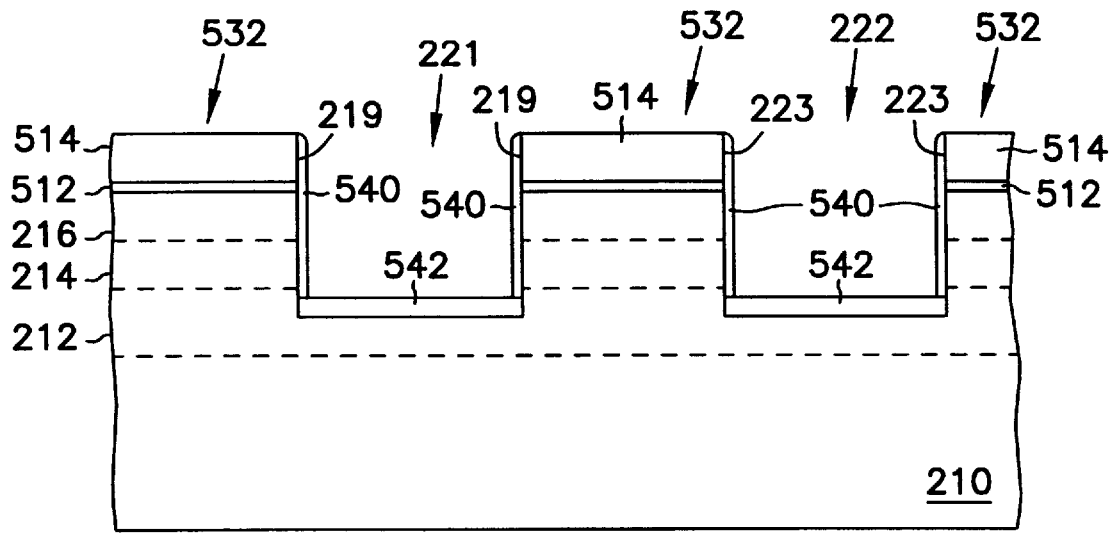
Figure 5H:
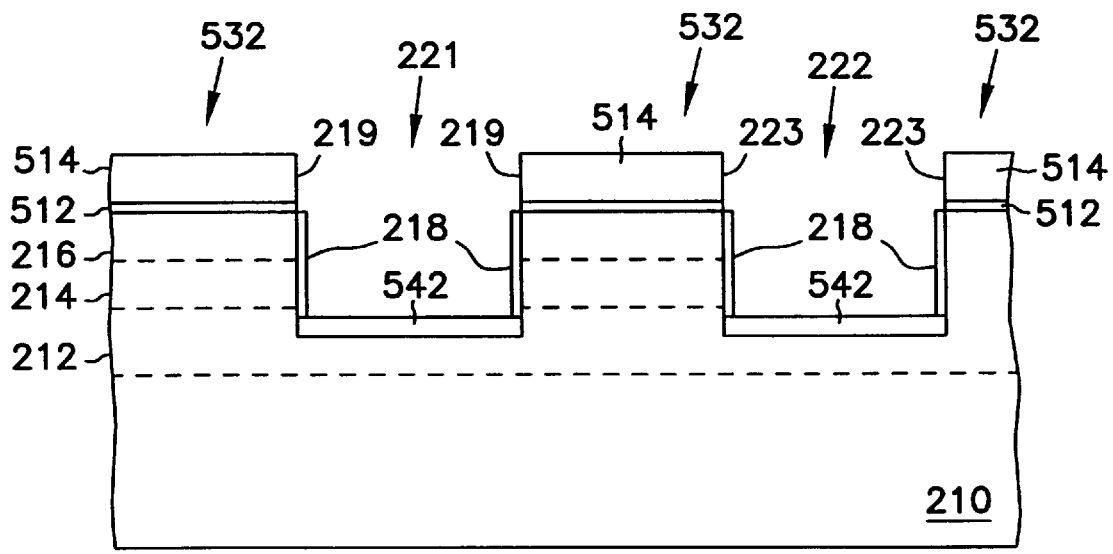
Figure 5I:
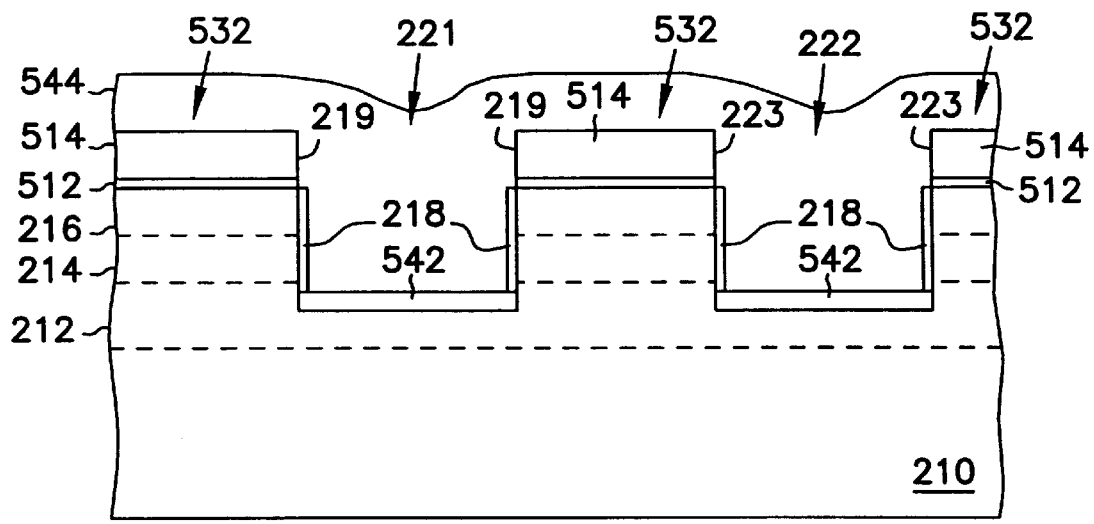
Figure 5J:
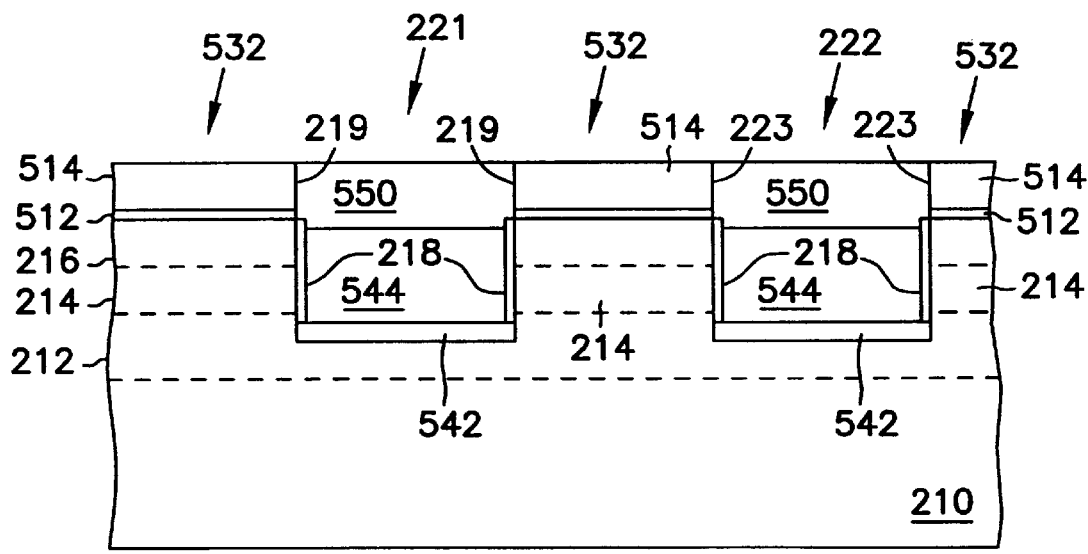
Figure 5K:
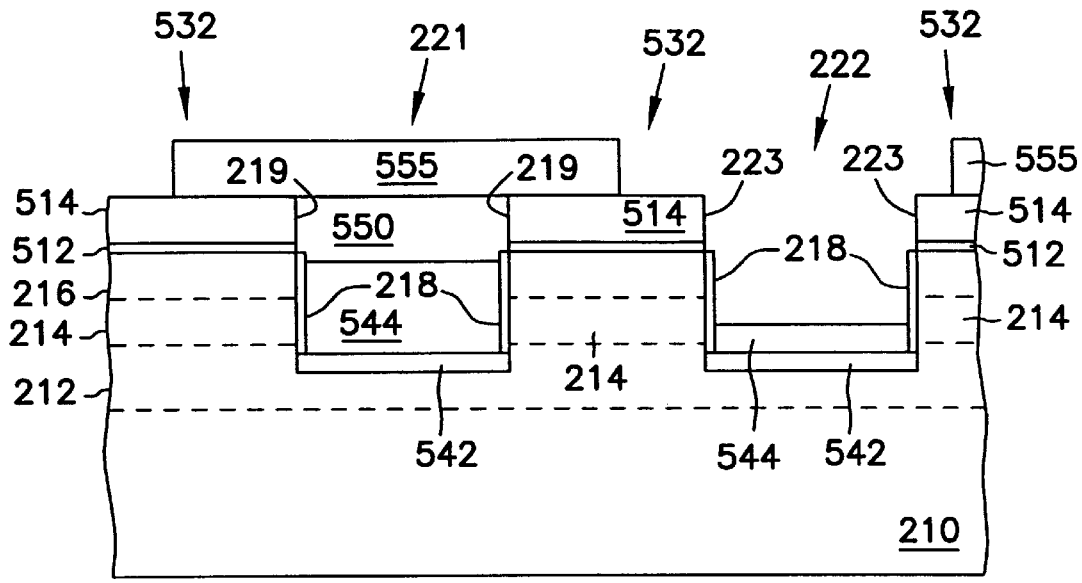
Figure 5L:
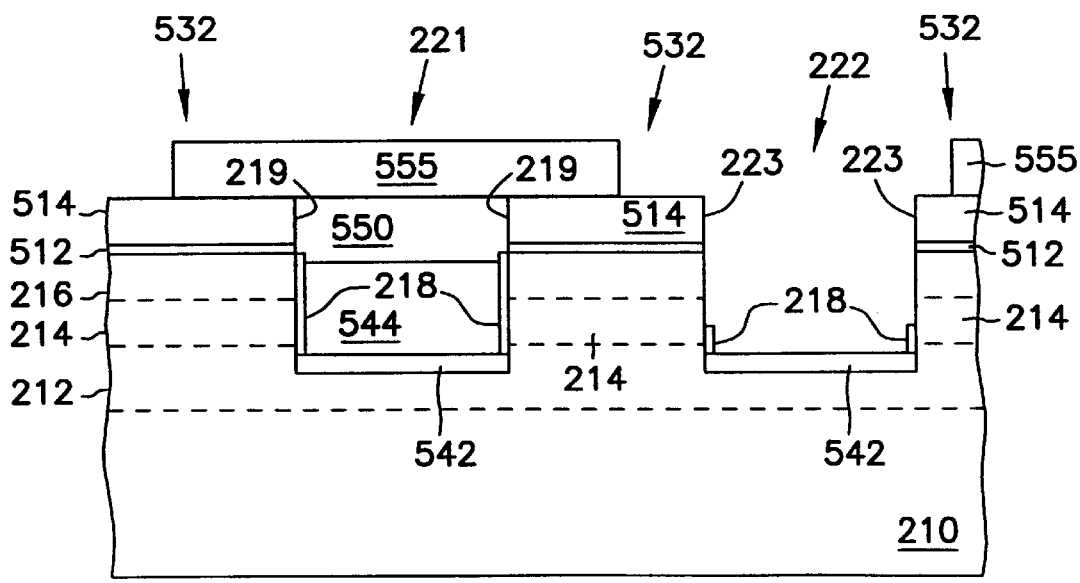
Figure 5M:
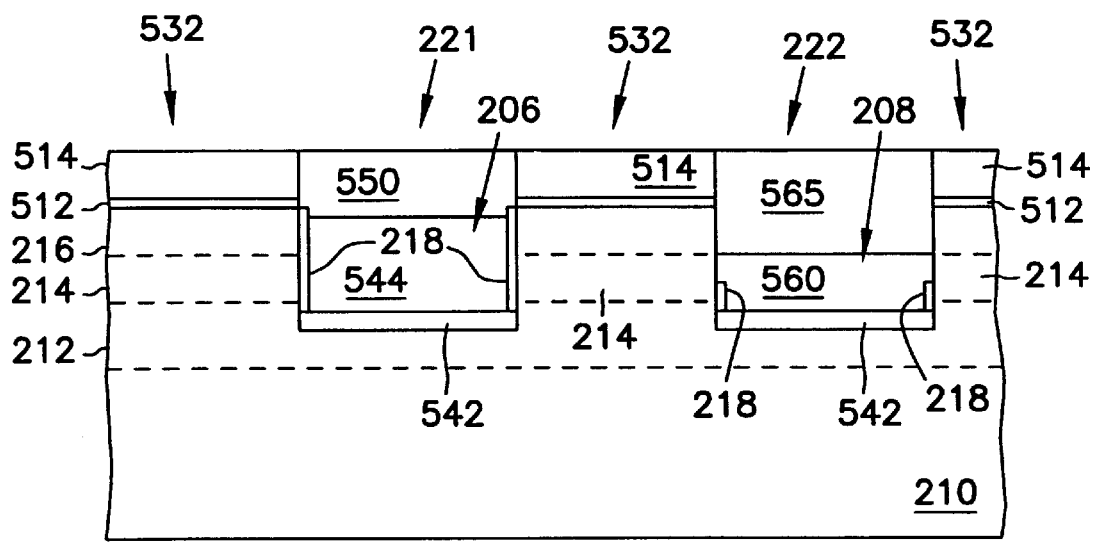
Figure 5N:
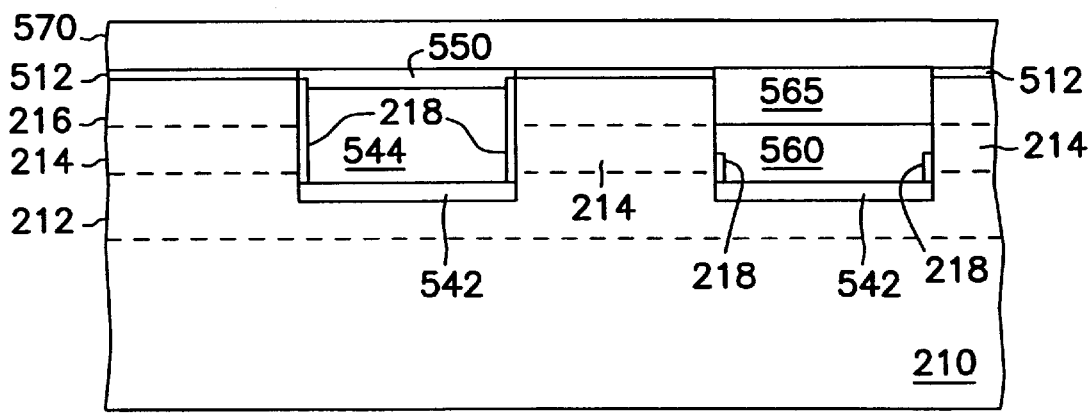

FIGS. 5A–N describe generally various processing techniques of one embodiment of a method of fabricating memory cells 112, such as shown in FIGS. 2–4, using bulk silicon processing techniques. In the embodiment of FIG. 5A, a p− bulk silicon substrate 210 staring material is used. An n++ and n+ silicon composite first source/drain layer 212 is formed on substrate 210, such as by ion-implantation, epitaxial growth, or a combination of such techniques. The more heavily conductively doped lower portion of first/ source drain layer 212 also functions as the bit line 202. The thickness of the n++ portion of first source/drain layer 212 is that of the desired bit line 202 thickness, which can be approximately between 0.1 to 0.25 μm. The overall thickness of the composite first source/drain layer 212 can be approximately between 0.2 to 0.5 μm. A body region layer 214 of p− silicon is formed, such as by epitaxial growth, to a thickness that can be about 0.4 μm. A second source/drain region layer 216 of n+ silicon is formed, such as by ion-implantation into body region layer 214 or by epitaxial growth on body region layer 214. The thickness of second source/drain layer 216 can be approximately between 0.2 and 0.5 μm.

In FIG. 5B, a silicon dioxide ($SiO_2$) thin pad oxide layer 512 is formed on second source/drain region 216, such as by chemical vapor deposition (CVD). In one embodiment, pad oxide layer 512 can be approximately 10 nm thick. A thin silicon nitride ($Si_3N_4$) layer 514 is formed on pad oxide layer 512, such as by CVD. In one embodiment, nitride layer 514 of can be approximately 100 nm in thickness.

In FIG. 5C, photoresist is applied and selectively exposed to provide a mask for the directional etching of trenches 220, such as by reactive ion etching (RIE), resulting in a plurality of column bars 516. Each column bar 516 contains the stack of nitride layer 514, pad oxide layer 512, second source/ drain layer 216, body region layer 214, and first source/drain layer 212. Trenches 220 are etched to a depth that is sufficient to reach the surface 518 of substrate 210, thereby providing separation between conductively doped bit lines 202. Bars 516 are oriented in the direction of bit lines 202. In one embodiment, bars 516 have a surface line width of approximately one micron or less. The depth and width of each trench 220 can be approximately equal to the line width of bars 516.

In FIG. 5D, the photoresist is removed. Isolation material 224, such as $SiO_2$, is deposited to fill the trenches 220. The working surface is then planarized, such as by chemical mechanical polishing/planarization (CMP).

FIG. 5E in the view of FIG. 5D after clockwise rotation by ninety degrees. In FIG. 5E, a photoresist material is applied and selectively exposed to provide a mask for the directional etching of trenches 221 and 222, such as by reactive ion etching (RIE). The directional etching of trenches 221 and 222 results in a plurality of row bars 532 that are disposed orthogonally to bit lines 202. Forming trenches 221 and 222 includes etching though stacked layers in the portions of bars 516. Forming trenches 221 and 222 also includes etching through the isolation material 224 disposed between bars 516.

More particularly, trenches 221 and 222 are etched through nitride layer 514, pad oxide layer 512, second source/drain layer 216, body region layer 214, and partially into first source/drain layer 212. Trenches 221 and 222 are etched into bars 516 to a depth of about 100 nm into first source/drain layer 212, leaving intact the underlying bit line 202 portion of the first source/drain layer 212. Trenches 221 and 222 are also etched into the isolation material 224 between bars 516. In one embodiment, after etching nitride layer 514 of bars 516, a nonselective dry etch is used to remove portions of the isolation material 224 between bars 516 and also the pad oxide layer 512, second source/drain layer 216, body region layer 214, and a portion of first source/drain layer 212 of bars 516. The directional etching of trenches 221 and 222 results in the formation of a plurality of row bars 532 that are orthogonal to column bars 516.

FIG. 5F is a plan view illustrating generally the arrangement of parallel bars 516, and trenches 220 interposed therebetween. Bars 532 are arranged orthogonally to bars 516. Trenches 221 and 222 are alternatingly interposed between ones of bars 532. The resulting semiconductor pillars in the intersecting portions of bars 532 and 516 provide first and second source drain regions 212 and 216, respectively, and body region 214 for access FETs 130 of memory cells 112.

In FIG. 5G, which is oriented similarly to FIG. 5E, a conformal silicon nitride layer 540 is formed, such as by CVD. Nitride layer 540 is directionally etched, such as by RIE, to leave resulting portions of nitride layer 540 only in respective sidewalls 219 and 223 of the bars 532 adjacent to respective trenches 221 and 222. In one embodiment, the thickness of directionally etched nitride layer 540 is about 20 nm. An oxide layer 542 is formed, such as by thermal growth, at the base portions of trenches 221 and 222. Oxide layer 542 insulates the underlying bit lines 202 from structures subsequently formed in trenches 221 and 222. After forming oxide layer 542, remaining portions of nitride layer 540 are removed.

In FIG. 5H, a gate oxide 218 is formed on the respective exposed sidewalls 219 and 223 portions in respective trenches 221 and 222 of second source/drain region 216, body region 214, and first source/drain region 212. In one embodiment, gate oxide 218 is a high-quality thin oxide layer that is thermally grown on the respective exposed sidewalls 219 and 223 of respective trenches 221 and 222.

In FIG. 5I, a conductive layer 544 is formed over the working surface of the wafer, including filling trenches 221 and 222 in which word line 206 and body line 208 will respectively be formed. In one embodiment, conductive layer 544 is formed by CVD of a refractory metal, such as tungsten. In another embodiment, conductive layer 544 is formed by CVD of n+ polysilicon. Other suitable conductive materials could also be used.

In FIG. 5J, CMP or other suitable planarization process is used to remove portions of conductive layer 544 above nitride layer 514. Conductive layer 544 is etched to form recesses in trenches 221 and 222. In one embodiment, the depth of the recesses is slightly below the interface between pad oxide 512 and second source/drain layer 216. An insulator, such as oxide layer 550 is formed, such as by CVD, over the working surface of the wafer. Oxide layer 550 fills the recesses in trenches 221 and 222. CMP or other suitable planarization process is used to remove excess portions of oxide layer 550 above nitride layer 514.

In FIG. 5K, a photoresist layer 555 is deposited and selectively removed, leaving portions of photoresist layer 555 covering alternate trenches, such as trench 221, and leaving exposed the other alternate trenches, such as trench 222. Oxide layer 550 in trench 222 is substantially removed, such as by etching. Underlying conductive layer 544 in trench 222 is etched back to a level that is approximately just above the interface between first source/drain layer 212 and body region layer 214.

In FIG. 5L, the exposed portions of gate oxide 218 in trench 222, above the surface of the conductive layer 544 therein, are removed from the exposed sidewalls 223 of trench 222, such as by isotropic etching. Remaining portions of conductive layer 544 in trench 222 are removed, such as by directional etching that selectively removes polysilicon but not oxide. As a result, portions of gat oxide 218 remain in trench 222, isolating adjacent portions of first source/drain layer 212 from trench 222.

In FIG. 5M, photoresist layer 555 is removed, such as by conventional photoresist stripping techniques. A conductive layer 560 is formed over the working surface of the wafer, filling trench 222. In one embodiment, conductive layer 560 is formed by CVD of a refractory metal, such as tungsten. In another embodiment, conductive layer 560 is formed by CVD of p+ polysilicon. Conductive layer 560 is etched back, over the surface of the wafer and in trench 222, to a level within trench 222 that is approximately just below the adjacent interface between body region layer 214 and second source/drain region layer 216. An insulating layer 565, such as oxide, is formed over the working surface of the wafer, filling trench 222. CMP or other suitable planarization process is used to remove portions of insulating layer 565 above nitride layer 514.

As described with respect to FIGS. 5A–M, word line 206 in trench 221 is formed from conductive layer 544. Body line 208 in trench 222 is formed from conductive layer 560. Word line 206 provides gate regions that are capacitively coupled to body regions 214 of access FETs 130 that are adjacent to each side of trench 221, such as in memory cells 112a–b and 112d–e. Body line 208 provides interconnected ohmic body contacts to body regions 214 of access FETs 130 that are adjacent to each side of trench 222, such as in memory cells 112b–c and 112e–f. Word line 206 and body line 208 can be provided control signals via contacts that are located outside array 110.

In FIG. 5N, nitride layer 514 is removed, such as by etching, and an insulator, such as $SiO_2$ is formed over the working surface of the wafer, such as by CVD. The structure thus formed is then processed to fabricate a storage capacitor 132 on the upper surface of each memory cell 112, using known techniques, followed by conventional back end of line (BEOL) procedures.

Figure 6:
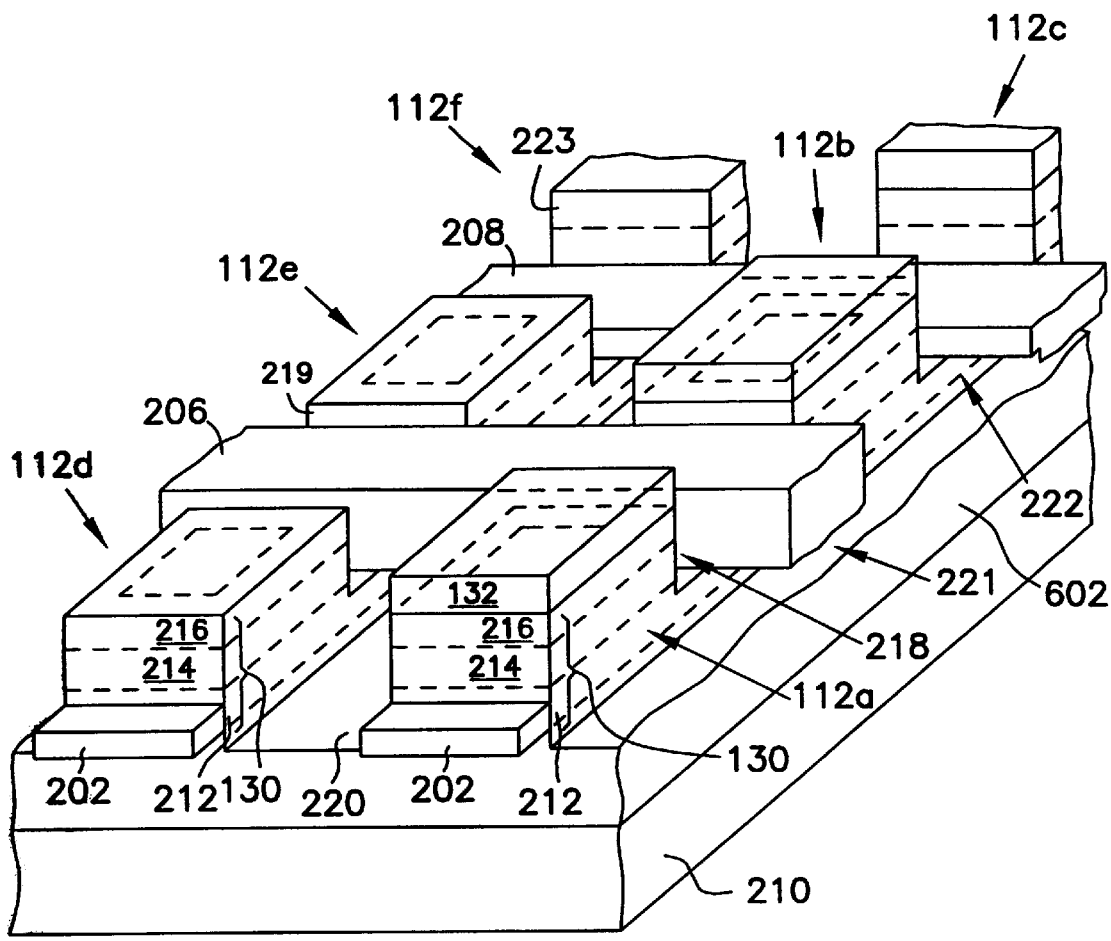
FIG. 6 is a perspective view illustrating generally another embodiment of a portion of a memory according to the present invention having a semiconductor-on-insulator (SOI) substrate.

FIG. 6 is a perspective view illustrating generally another embodiment of a portion of a memory according to the present invention, similar to that described with respect to FIG. 2. FIG. 6, however, illustrates an embodiment of the present invention having a semiconductor-on-insulator (SOI) substrate 210 rather than a bulk semiconductor substrate 210. In one embodiment, SOI substrate 210 of FIG. 6 is obtained using an SOI starting material. In another embodiment, described below, a bulk semiconductor starting material is used, and bars of SOI are formed during fabrication of memory 100, such that the semiconductor pillars, in which portions of access FETs 130 are formed, extend outwardly from an insulating portion 602 of substrate 210.

One such method of forming bars of SOI is described in the Noble U.S. patent application Ser. No. 08/745,708 which is assigned to the assignee of the present application and which is herein incorporated by reference. Another such method of forming regions of SOI is described in the Forbes U.S. patent application Ser. No. 08/706,230, which is assigned to the assignee of the present application and which is herein incorporated by reference.

Figure 7A:
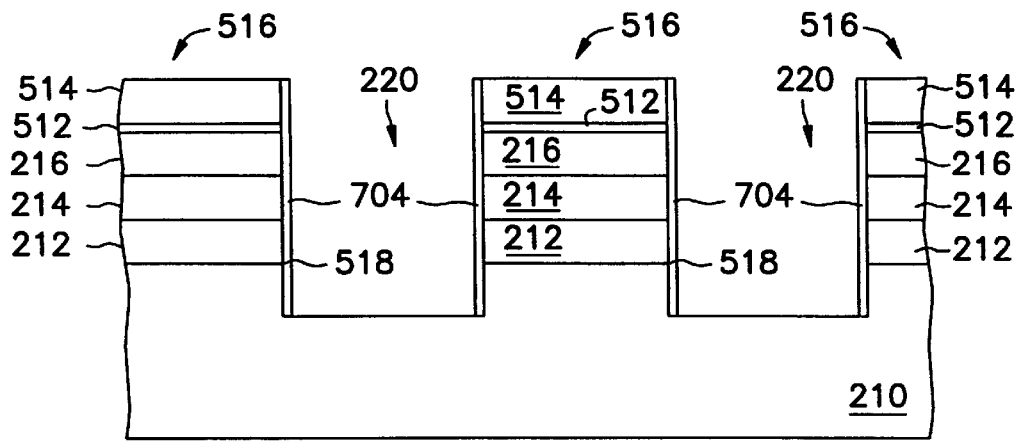
FIGS. 7A–C illustrate generally, by way of example, additional steps used to form SOI bars according to one embodiment of the invention.
Figure 7B:
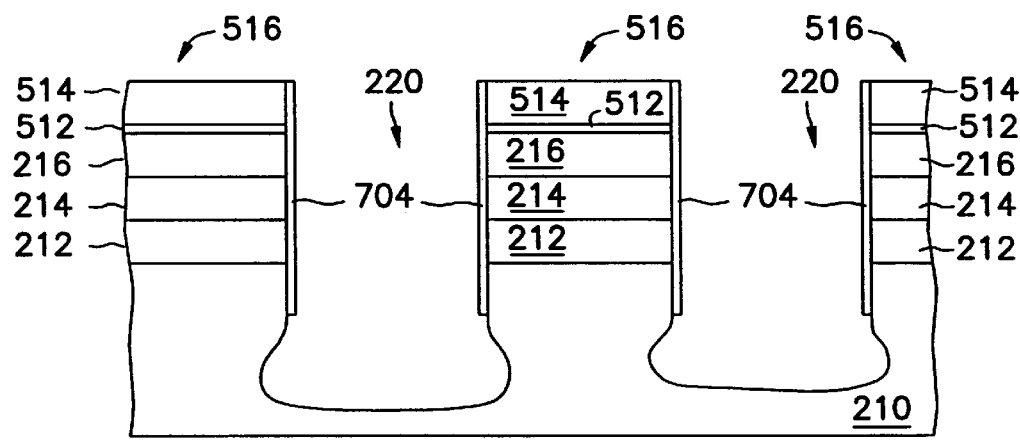
Figure 7C:
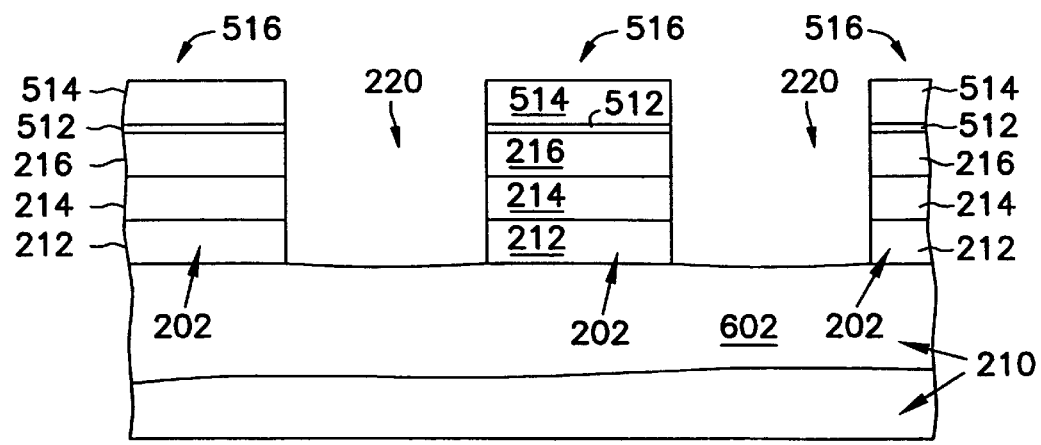

FIGS. 7A–C illustrate generally, by way of example, additional steps used to form SOI bars during the fabrication steps described above with respect to FIGS. 5A–N, such that the semiconductor pillars, in which portions of access FETs 130 are formed, extend outwardly from an insulating portion 602 of substrate 210, resulting in the structure illustrated in FIG. 6.

In FIG. 7A, the processing steps described above with respect to FIGS. 5A–C are carried out, forming trenches 220 that are etched to a depth that is below the original surface 518 of substrate 210, such as by approximately greater than or equal to 0.6 $\mu$m. A conformal nitride layer 704 is formed, such as by CVD, over the working surface of the wafer, lining trenches 220. Nitride layer 704 is directionally etched, such as by RIE, to remove nitride layer 704 from the base regions of trenches 220. Portions of nitride layer 704 remain on the sidewalls of trenches 220 to protect adjacent layers during subsequent etching and oxidation.

In FIG. 7B, an isotropic chemical etch of silicon is used to partially undercut bars 516. For example, hydrofluoric acid (HF) or a commercial etchant sold under the trade name CP4 (a mixture of approximately 1 part (46%, HF):1 part ($CH_3COOH$):3 parts ($HNO_3$)) can be used for the isotropic etchant. In one embodiment, the partial undercutting of bars 516 by isotropic etching is timed to remove a volume of silicon that is sufficient to compensate for a subsequently formed volume of oxide, described below. In general, the subsequent oxidation step produces a volume of oxide that is approximately twice that of the silicon consumed during the oxidation step described below.

In FIG. 7C, substrate 210 is oxidized using a standard semiconductor processing furnace at a temperature of approximately 900 to 1,100 degrees (Celsius. A wet oxidizing ambient is used in the furnace chamber to oxidize the exposed silicon regions in the lower portion of trenches 220. Substrate 210 is oxidized for a time period that is sufficient to form oxide insulating portion 602 that fully undercuts bars 516. Insulating portion 602 underlies both bars 516 and trenches 220. Insulating portion 602 isolates the bit lines 202, and access FETs 130 formed on bit lines 202, from an underlying semiconductor portion of substrate 210. Nitride layer 704 is removed, such as by etching, and processing then continues as described above with respect to FIGS. 5D–N, resulting in the structure generally illustrated by FIG. 6.

In one embodiment, bars 516 are sufficiently narrow such that the oxidation step that undercuts bars 516 produces sufficient oxide to fill trenches 220, resulting in a generally planar structure. This avoids the need for a separate step of depositing an oxide isolation material 224 such as described with respect to FIG. 5D. The oxidation time period depends on the width of bars 516 and the effective width of bars 516 after the undercut etch step. Narrower bars 516 require shorter oxidation times. For example, for sub-0.25 micron technology, oxidation time is approximately 1 hour. In another embodiment, the etch step fully undercuts bars 516 before oxidation. This further reduces oxidation time.

Figure 8:
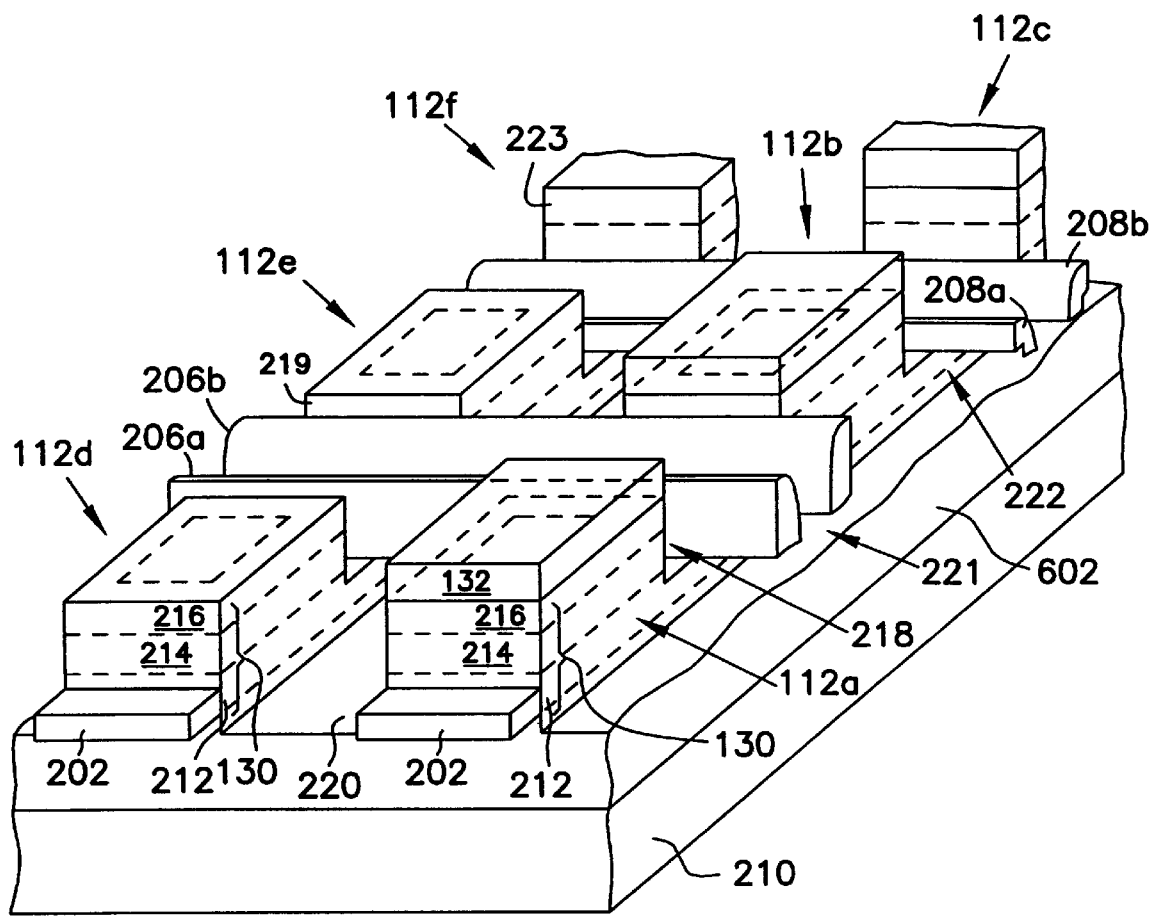
FIG. 8 is a perspective view illustrating generally another embodiment of a portion of a memory according to the present invention in which split gates and body lines are formed.
Figure 10:
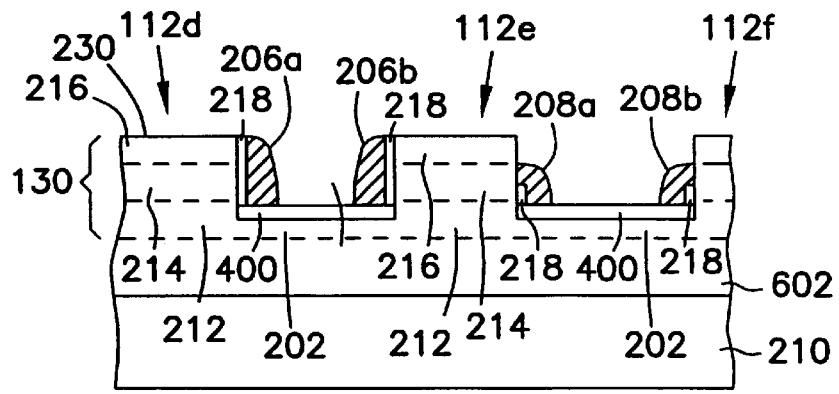
FIG. 10 is a cross-sectional view taken along the cut line 10—10 of FIG. 9.
Figure 9:
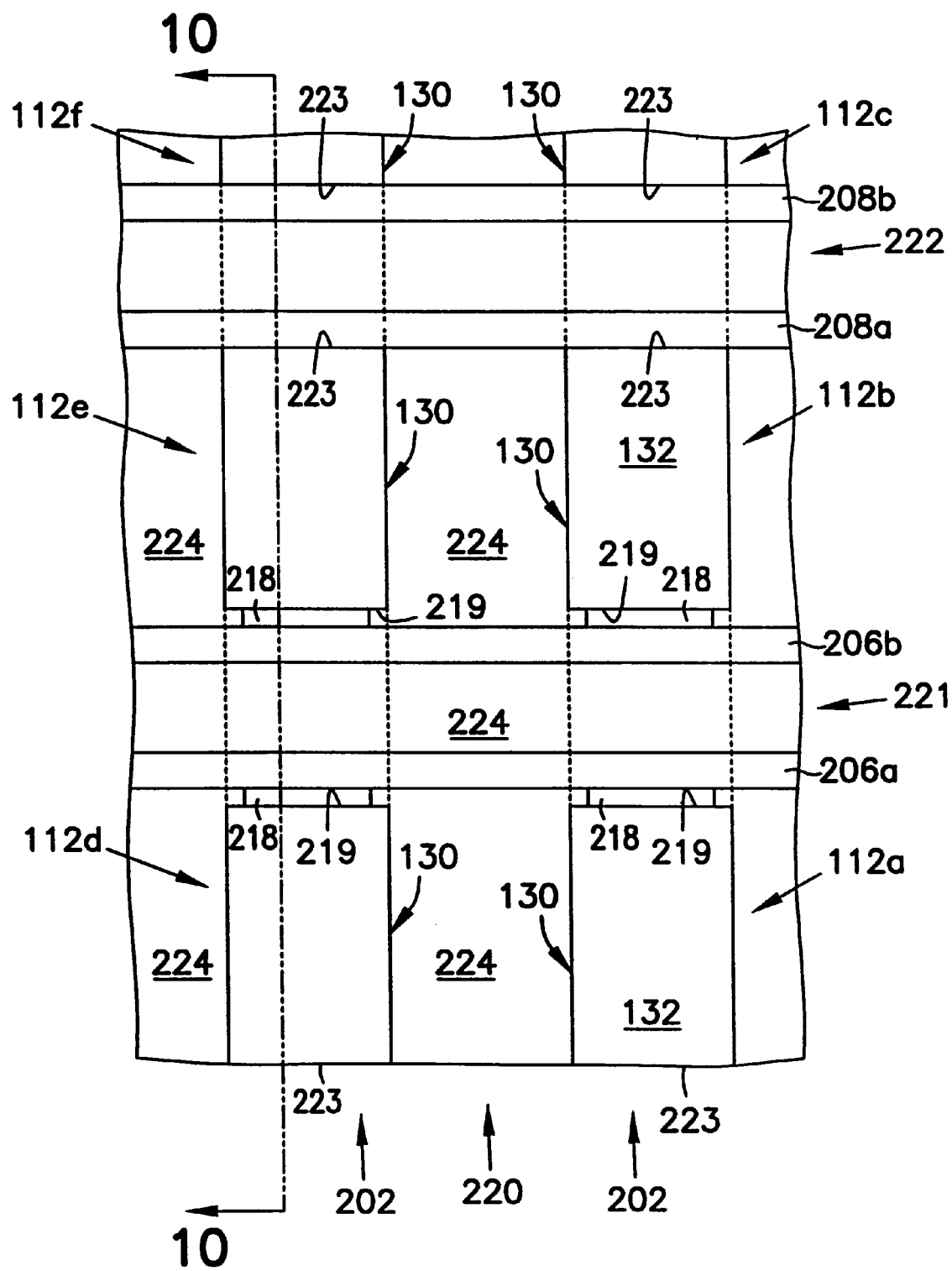
FIG. 9 is a plan view illustrating generally memory cells according to a split gate and body line embodiment of the invention as viewed from above the structures formed on the substrate.

FIGS. 8–10 illustrate generally another embodiment of a portion of a memory according to the present invention, similar to that described with respect to FIG. 6. In the embodiment of FIGS. 8–10, however, word line 206 and body line 208 are each split into separate conductors. Word line 206 is split into independently operable word lines 206a and 206b, each disposed in trench 221 and electrically isolated from each other, such as by $SiO_2$. Body line 208 is split into independently operable body lines 208a and 208b, each disposed in trench 222 and electrically isolated from each other, such as by $SiO_2$. Thus, gate regions need not be shared between access FETs 130 in memory cells 112 on opposing sides of trench 221. Similarly, body lines need interconnect body contacts to body regions 214 of access FETs 130 in memory cells 112 on opposing sides of trench 222. Word line 206 can be formed of a refractory metal or n+ polysilicon or other suitable conductor, as described above. Similarly, body line 208 can be formed of a refractory metal or p+ polysilicon or other suitable conductor, as described. above.

In FIGS. 8–10, for example, word line 206a extends in trench 221 adjacent to the vertical sidewalls 219 of the semiconductor pillars of in-line memory cells 112a and 112d, separated therefrom by gate oxide 218. Word line 206b extends in trench 221 adjacent to the vertical sidewalls 219 of the semiconductor pillars of in-line memory cells 112b and 112e, separated therefrom by gate oxide 218. Body line 208a extends in trench 222 adjacent to the vertical sidewalls 223 of the semiconductor pillars of in-line memory cells 112b and 112e. Body line 208a contacts body regions 214 of the semiconductor pillars of in line memory cells 112b and 112e. Body line 208b extends in trench 222 adjacent to the vertical sidewalls 223 of the semiconductor pillars of in-line memory cells 112c and 112f. Body line 208b contacts body regions 214 of the semiconductor pillars of in line memory cells 112c and 112f.

Operation of the access FET 130 of memory cell 112b, for example, includes operation of word line 206b and body line 208a, as similarly described above. A positive potential, such as approximately 1.5 V, is applied to word line 206b to turn on the access FET 130 of memory cell 112b. A positive potential, such as approximately 0.5 V is synchronously applied to body line 208a, as similarly described above, to decrease the turn-on threshold voltage of the access FET 130 and thereby increase the effective gate overdrive voltage provided on the word line 206. Since word line 206b is not shared by the access FET 130 of memory cell 112a, sub-threshold leakage is not induced in the access FET 130 of memory cell 112a during activation of word line 206b to operate the access FET 130 of memory cell 112b. Similarly, since body line 208a is not shared by the access FET 130 of memory cell 112c, body line 208b can be maintained at its standby voltage of approximately −1.5 V. As a result, the threshold voltage of the access FET 130 of memory cell 112c remains relatively high during activation of word line 206b and body line 208a, thereby reducing subthreshold leakage currents and increasing data retention time.

The use of split word lines 206a–b and split body lines 208a–b avoids the problem of increased sub-threshold conduction in access FETs 130 in one row while the memory cells 112 in the adjacent row are being addressed. Each memory cell 112 is capable of being uniquely addressed by a combination of word line 206 and body line 208 voltages. These voltages need not appear on the word line 206 and body line 208 of adjacent rows of memory cells 112.

The structures of FIGS. 8–10 can be fabricated by process steps similar to those described with respect to FIGS. 5A–C forming bars 516 separated by trenches 220. This is followed by the process steps described with respect to FIGS. 7A–C follow, isolating bars 516 from an underlying semiconductor portion of substrate 210 by insulating portion 602. This is followed by the process steps described with respect to FIGS. 5D–I forming trenches 221 and 222 that are filled with a conductive layer 544, as described above. This is followed by the process steps described below with respect to FIGS. 11A–E.

Figure 11A:
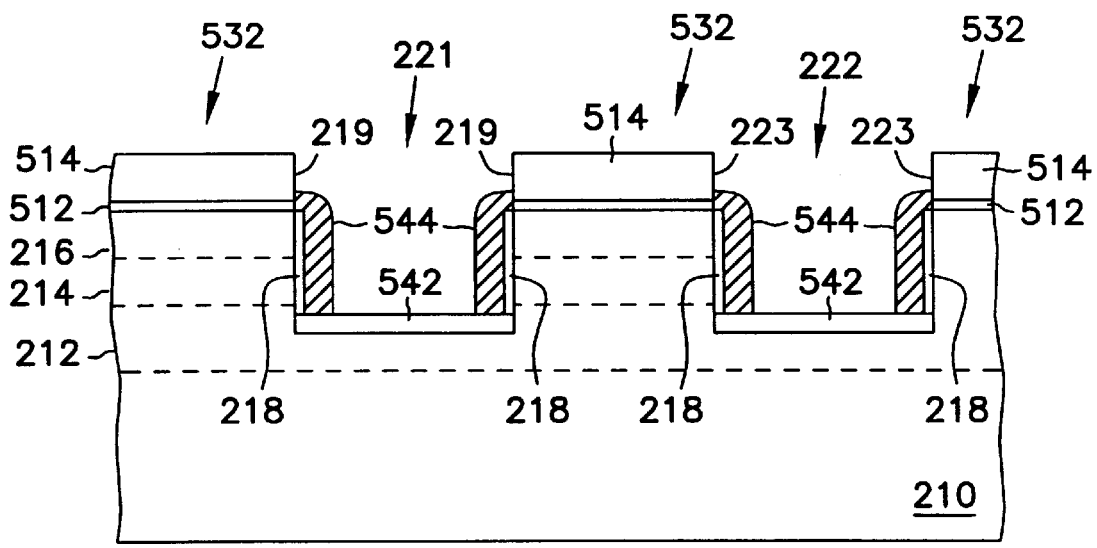
FIGS. 11A–E describe generally various processing techniques of one method of fabricating a split gate and body line embodiment according to the invention.

In FIG. 11A, portions of conductive layer 544 are removed, such as by RIE or other directional etching technique, leaving spacer portions of conductive layer 544 along sidewalls 219 of trenches 221 and sidewalls 223 of trenches 222.

Figure 11B:
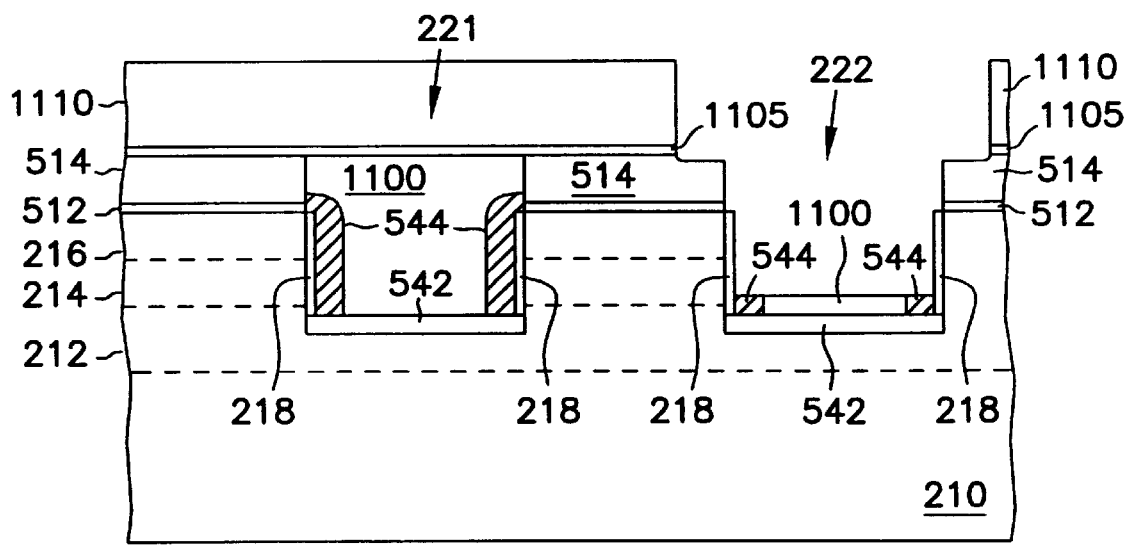

In FIG. 11B, a layer 1100, such as intrinsic polysilicon, is formed over the worlding surface of the wafer, such as by CVD, thereby filling trenches 221 and 222. CMP or other suitable planarization technique is used to remove portions of layer 1100 above the surface of nitride layer 514, resulting in a planar working surface of the wafer at approximately the level of the upper surface of nitride layer 514. A thin cap layer 1105, such as $Si_3N_4$, is formed on the working surface of the wafer. In one embodiment, nitride cap layer 1105 can be approximately 10 nanometers thick. A photoresist layer 1110 is formed and selectively removed, leaving portions of photoresist layer 1110 covering alternate trenches, such as trench 221, and leaving exposed the other alternate trenches, such as trench 222. The exposed nitride cap layer 1105 over trench 222 is removed, such as by an etch that is timed to avoid removing substantial amounts of underlying nitride layer 514. Exposed portions of layer 1100 and layer 544 in trench 222 are recess etched together, such as by RIE to a depth in trench 222 that is between the upper and lower surfaces of adjacent body region layer 214.

Figure 11C:
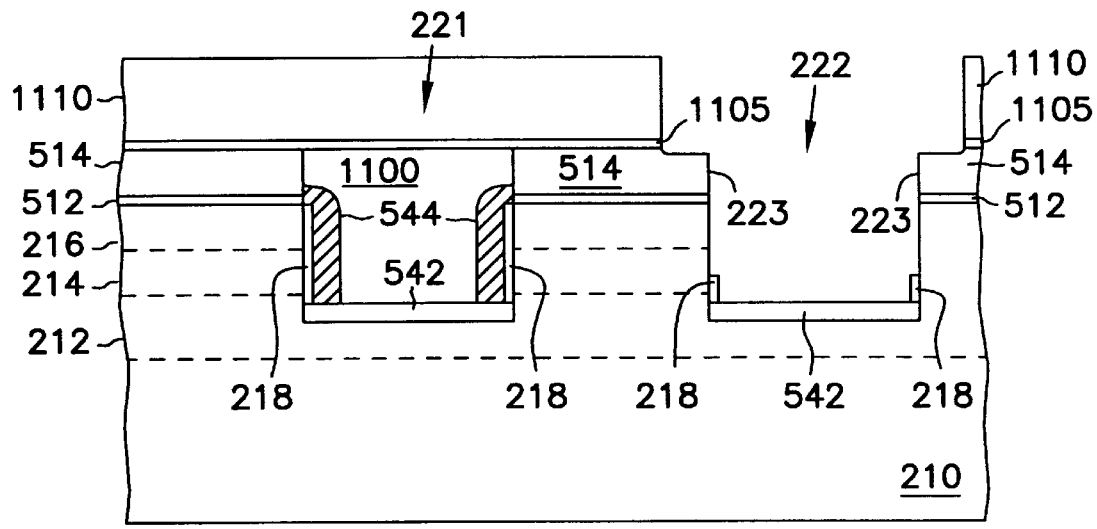

In FIG. 11C, an isotropic etch is used to remove the exposed portions of gate oxide 218 from the sidewalls 223 of trench 222. In one embodiment, the isotropic etching of exposed portions of gate oxide 218 is timed to avoid significant removal of unexposed portions of gate oxide 218, near the base of trench 222, and underlying oxide layer 542. Remaining portions of layer 1100 and layer 544 in trench 222 are removed, such as by RIE. Resulting portions of gate oxide 218 are left behind for isolating adjacent first/source drain region layer 212 portions of the sidewalls 223 of trench 222 from the interior region of trench 222.

Figure 11D:
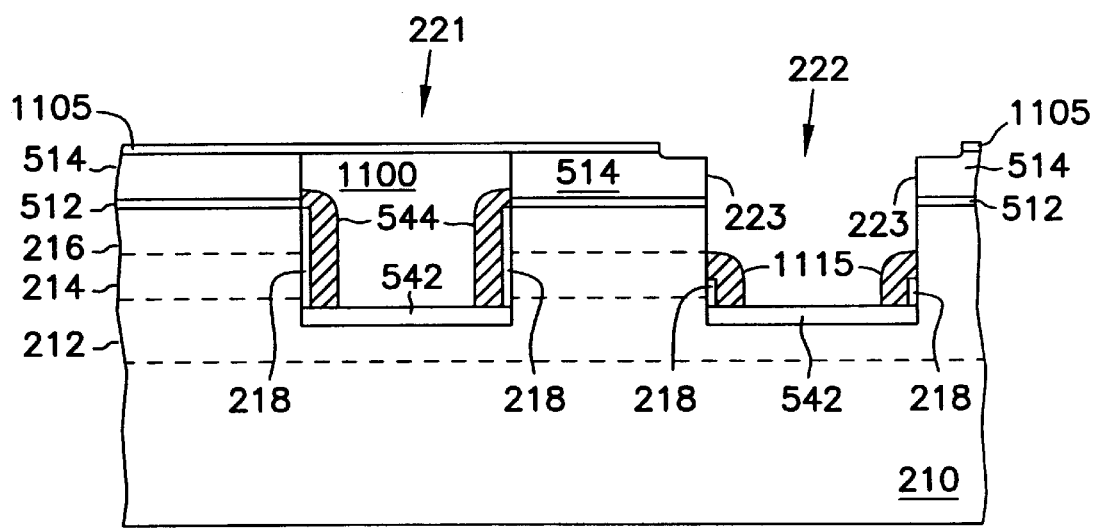

In FIG. 11D, photoresist layer 1110 is removed, such as by conventional photoresist stripping techniques. A conductive layer 1115 is formed on the working surface of the wafer, filling trench 222. In one embodiment, conductive layer 1115 is formed by CVD of a refractory metal, such as tungsten. In another embodiment, conductive layer 1115 is formed by CVD of p+ polysilicon. Other suitable conductive materials could also be used to obtain an ohmic contact to portions of p– silicon body region layer 214 at sidewall 223 of trench 222. Portions of conductive layer 1115 are removed, such as by RIE or other directional etch. In one embodiment, the directional etching leaves behind remaining portions of conductive layer 1115 only on sidewalls 223 of trench 222 approximately below the interface between body region layer 214 and second source/drain region layer 216.

Figure 11E:
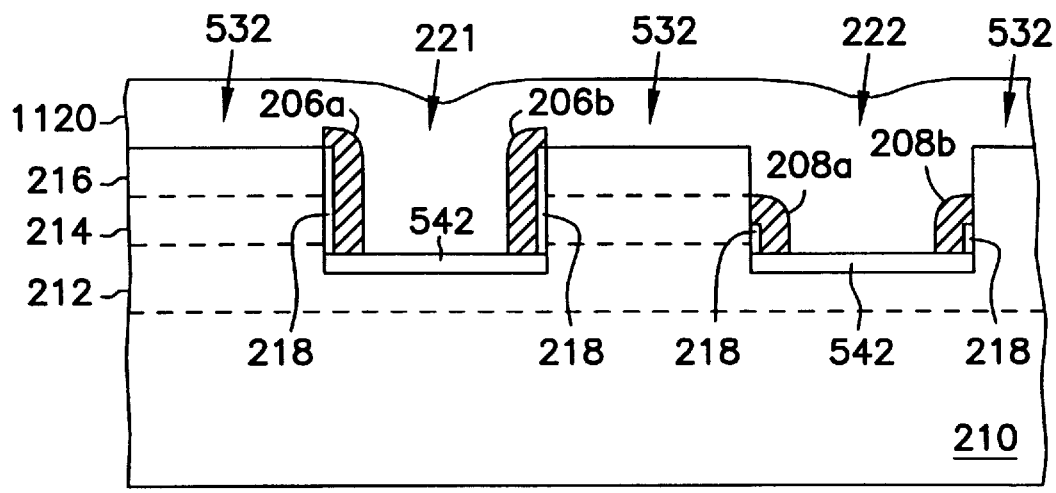

In FIG. 11E, remaining portions of nitride thin cap layer 1105 are substantially removed, such as by etching. Intrinsic polysilicon layer 1100 in trench 221 is removed, such as by a selective wet etchant that removes intrinsic, but not doped polysilicon. An insulating layer 1120, such as $SiO_2$, is formed over the working surface of the wafer, such as by CVD, thereby filling trenches 221 and 222. The structure thus formed is then processed to fabricate a storage capacitor 132 on the upper surface of each memory cell 112, using known techniques, followed by conventional back end of line (BEOL) procedures.

The process steps described above with respect to FIGS. 11A–E, result in separate word lines 206a-b in trench 221. Word lines 206a-b are formed from conductive layer 544. Separate body lines 208a-b in trench 222 also result from the process steps described above with respect to FIGS. 11A–E. Body lines 208a-b are formed from conductive layer 1115. Word line 206a provides gate regions that are capacitively coupled to body regions 214 of access FETs 130 adjacent to a first side of trench 221, such as in memory cells 112a and 112d. Word line 206b, provides gate regions that are capacitively coupled to body regions 214 of access FETs 130 adjacent to a second side of trench 221, such as in memory cells 112b and 112e. Body line 208a provides interconnected ohmic body contacts to body regions 214 of access FETs 130 adjacent to a first side of trench 222, such as in memory cells 112b and 112e. Body line 208b provides interconnected ohmic body contacts to body regions 214 of access FETs 130 adjacent to a second side of trench 222, such as in memory cells 112c and 112f. Word lines 206a–b and body lines 208a–b can be provided control signals via contacts made outside array 110.

Figure 12:
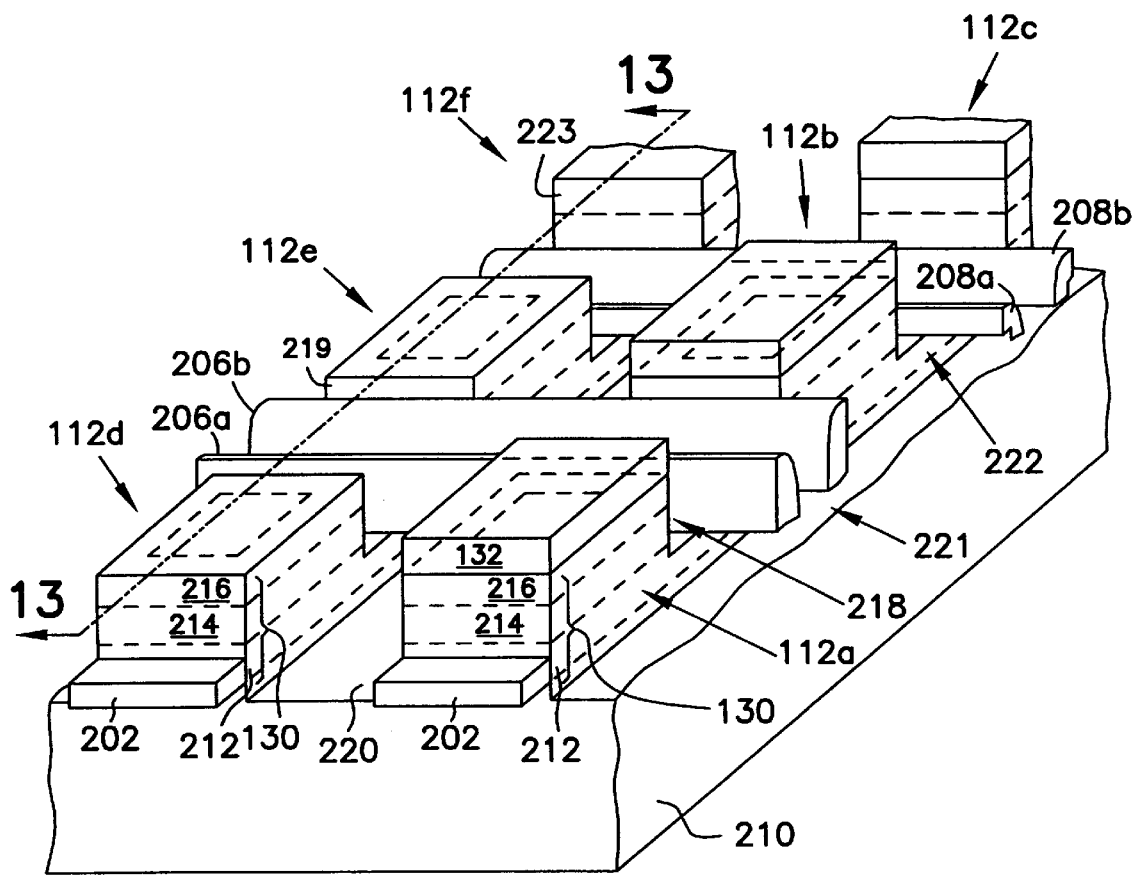
FIG. 12 is a perspective view illustrating generally another embodiment of a portion of a memory according to the present invention including split grates and body lines and a bulk semiconductor substrate.
Figure 13:
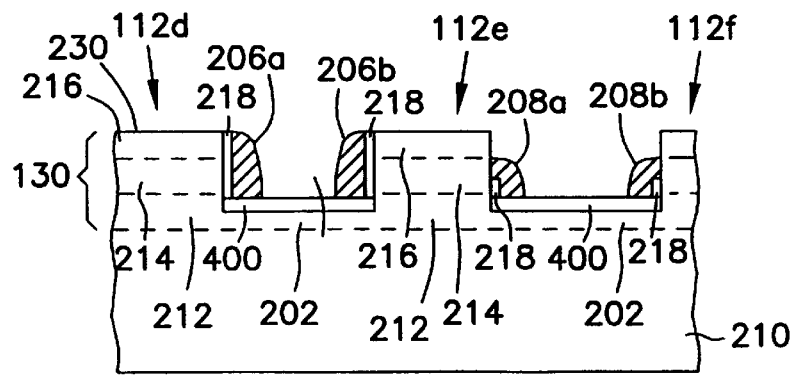
FIG. 13 is a cross-sectional view taken along the cut line 13—13 of FIG.

FIGS. 12-13 illustrate generally another embodiment of a portion of a memory according to the present invention, similar to that described with respect to FIGS. 8–10, but fabricating using a bulk silicon substrate 210, as described with respect to FIGS. 2–4. The structures of FIGS. 12-13 are fabricated by process steps similar to those described with respect to FIGS. 5A–I forming trenches 221 and 222 that are filled with a conductive layer 544, as described above. The process steps described with respect to FIGS. 7A–C are omitted from this embodiment.

Instead, the process steps described with respect to FIGS. 5A–I are followed by the process steps described with respect to FIGS. 11A–E, resulting in the structures of FIGS. 12-13.

Thus, it has been shown that the invention provides integrated circuit structures and fabrication methods, such as for DRAM memory cell arrays and other semiconductor devices. Each memory cell includes a vertical access FET, formed on a buried bit line. The access FET has a gate that is integrally formed with a word line that is buried in a trench that extends along a side of the memory cell. The access FET has a body contact that is integrally formed with a body line that is buried in a trench that extends along another side of the memory cell. The buried word and body lines improve integration density. Each memory cell can be, fabricated in a surface area that is approximately $4F^2$, where F is a minimum lithographic feature size. In one embodiment, a common word line is shared by all of the access FETs that are located along both sides of the trench in which the word line is located. In another embodiment, a common body line interconnects the body regions of all of the access FETs that are located along both sides of the trench in which the body line is located. In a further embodiment, split word lines an, provided for separate addressing of gate regions of access FETs on opposite sides of the trench. In yet a further embodiment, split body lines are provided for separately interconnecting contacts to body regions of the access FETs on opposite sides of the trench. Each of the unitary and split word and body line embodiments can be fabricated on a bulk semiconductor substrate, or on a semiconductor-on-insulator (SOI) substrate that results from using an SOI starting material, or by forming SOI regions during fabrication.

It is to be understood that the above description is intended to be illustrative, and not restrictive. Combinations of the above embodiments, and other embodiments will be apparent to those of skill in the art upon reviewing the above description. The above structures and fabrication methods have been described, by way of example, and not by way of limitation, with respect to memory integrated circuits such as dynamic random access memories (DRAMs). However, the scope of the invention includes any other integrated circuit applications in which the above structures and fabrication methods are used. Thus, the scope of the invention is not limited to the particular embodiments shown and described herein.

What is claimed is:

1. An integrated circuit, comprising:
   a pillar of semiconductor material that extends outwardly from a working surface of a substrate, the pillar having a number of sides; and
   a transistor having a body region and first and second source/drain regions formed within the pillar, and having a gate and a body contact that are each associated with a side of the pillar.

2. The integrated circuit of claim 1, further comprising a storage capacitor coupled to the second source/drain diffusion.

3. The integrated circuit of claim 1, wherein the first source/drain region includes a more heavily doped bit line portion.

4. The integrated circuit of claim 1, wherein the pillar extends outwardly from an insulating portion of the substrate.

5. The integrated circuit of claim 1, wherein the pillar extends outwardly from a semiconductor portion of the substrate.

6. A memory device, comprising:
   an array of memory cells, each cell comprising a transistor including a semiconductor pillar forming body and first and second source/drain regions, and a gate and a body contact disposed adjacent to opposing sides of the pillar,
   a plurality of substantially parallel word lines, each word line disposed orthogonally to the bit lines in a trench between columns of the memory cells for addressing gates of the transistors of the memory cells that are adjacent to the trench in which the word line is disposed;
   a plurality of substantially parallel body lines, interdigitated with the word lines, each body line disposed orthogonally to the bit lines in a trench between columns of the memory cells for providing a signal to body regions of the transistors of the memory cells that are adjacent to the trench in which the body line is disposed; and
   a plurality of bit lines, proximal to the substrate, and interconnecting ones of the first source/drain regions of ones of the memory cells.

7. The memory device of claim 6, wherein each memory cell further comprises a storage capacitor coupled to the second source/drain diffusion.

8. The memory device of claim 6, wherein the pillars extend outwardly from an insulating portion of the substrate.

9. The memory device of claim 6, wherein the pillars extend outwardly from a semiconductor portion of the substrate.

10. The memory device of claim 6, wherein the integrated circuit surface area of the memory cell is $4F^2$, where F is a minimum feature size.

11. An integrated circuit, comprising:
    a pillar of semiconductor material that extends outwardly from a working surface of a substrate, the pillar having an upper surface and a number of sides; and
    a transistor having a vertically stacked body and first and second source/drain regions formed within the pillar, and having a gate and a body contact that are each associated with a side of the pillar, wherein the gate and the body contact are located below the upper surface of the semiconductor pillar.

12. The integrated circuit of claim 11, wherein the gate and the body contact are associated with opposite sides of the pillar.

13. The integrated circuit of claim 11, including an insulating layer between the first source/drain region and an underlying semiconductor portion of the substrate.

14. A memory array comprising:
    a plurality of substantially parallel bit lines at least partially on a substrate;
    a plurality of memory cells, each memory cell including an access transistor having body and first and second source/drain regions vertically formed on one of the bit lines, the second source/drain region including an upper semiconductor surface;
    a plurality of word lines and body lines, the word lines interconnecting gates of access transistors and the body lines interconnecting body regions of access transistors, the word and body lines interdigitated with each other and disposed orthogonally to the bit lines in isolation trenches, wherein the bit lines and the word and body lines are located below the upper semiconductor surface of the second source/drain region; and
    a plurality of isolation trenches extending parallel to and between the bit lines, and interposed between ones of the access transistors.

15. The memory array of claim 14, wherein the bit lines include portions of the first source/drain regions of ones of the access transistors.

16. The memory array of claim 14, wherein the word line provides common gate regions for access transistors on opposing sides of the trench in which the word line is disposed.

17. The memory array of claim 14, wherein the body line provides common interconnection to body regions of access transistors on opposing sides of the trench in which the body line is disposed.

18. The memory array of claim 14, wherein the word line provides separate conductors for gate regions of access transistors on opposite sides of the trench in which the word line is disposed.

19. The memory array of claim 14, wherein the body line provides separate conductors for second gate regions of access transistors on opposite sides of the trench in which the second word line is disposed.

20. The memory array of claim 14, including an insulating layer interposed between the bit lines and a semiconductor portion of the substrate.

21. A memory array comprising:
a plurality of substantially parallel bit lines at least partially on a substrate;
a plurality of memory cells, each memory cell including an access transistor having body and first and second source/drain regions vertically formed on one of the bit lines, the second source/drain region including an upper semiconductor surface;
a plurality of word line pairs, each word line pair disposed in first trenches extending orthogonal to the bit lines, each word line in the word line pair separated from the other word line in the word line pair;
a plurality of body line pairs, each body line pair disposed in second trenches that are interdigitated with the first trenches, wherein the second trenches extend orthogonal to the bit lines, each body line in the body line pair separated from the other body line in the body line pair; and
a plurality of isolation trenches extending parallel to and between the bit lines, and interposed between ones of the access transistors.

22. The memory array of claim 21, wherein the bit lines, word line pairs, and body line pairs are located below the upper semiconductor surface of the second source/drain region.

23. The memory array of claim 21, including an insulating layer interposed between the bit lines and a semiconductor portion of the substrate.

24. The memory array of claim 21, wherein the bit lines include at least a portion of ones of the first source/drain regions.

* * * * *

UNITED STATES PATENT AND TRADEMARK OFFICE
CERTIFICATE OF CORRECTION

PATENT NO. : 6,104,061
DATED : August 25, 2000
INVENTOR(S) : Forbes et al.

Page 1 of 1

It is certified that error appears in the above-identified patent and that said Letters Patent is hereby corrected as shown below:

Column 4:
Line 19, delete "FIG." and insert --FIG. 11--, therefor.

Column 5:
Line 49, delete "conducively" and insert --conductively--, therefor.

Column 7:
Line 18, delete "FET's 130" and insert --FETs 130--, therefor.

Column 11:
Line 50, delete "(Celsius." and insert --Celsius.--, therefor.

Column 12:
Line 27, delete "described. above." and insert --described above.--, therefor.

Column 12:
Line 27, delete "sidewals" and insert --sidewalls--, therefor.

Column 14:
Line 42, and 43, delete "¶" between "embodiment." and "Instead".

Column 14:
Line 65, delete "an" and inset --are--, therefor.

Signed and Sealed this

Twelfth Day of June, 2001

*Attest:*

NICHOLAS P. GODICI
*Attesting Officer*     *Acting Director of the United States Patent and Trademark Office*